United States Patent
Taguchi

(10) Patent No.: US 6,480,030 B1
(45) Date of Patent: Nov. 12, 2002

(54) BUS CONFIGURATION AND INPUT/OUTPUT BUFFER

(75) Inventor: Masao Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 09/648,621

(22) Filed: Aug. 28, 2000

Related U.S. Application Data

(62) Division of application No. 09/339,853, filed on Jun. 25, 1999, now Pat. No. 6,154,047, which is a division of application No. 08/754,760, filed on Nov. 21, 1996, now Pat. No. 5,949,252.

(30) Foreign Application Priority Data

Jul. 3, 1996 (JP) .............................. 8-173910

(51) Int. Cl.⁷ ......................................... H03K 19/0175
(52) U.S. Cl. ............................. 326/86; 326/90; 326/83
(58) Field of Search .............................. 326/26, 27, 30, 326/84, 85, 90, 83

(56) References Cited

U.S. PATENT DOCUMENTS

| | | | |
|---|---|---|---|
| 4,472,647 A | * 9/1984 | Allgood et al. | 307/475 |
| 4,719,369 A | 1/1988 | Asano et al. | 326/86 |
| 4,748,426 A | 5/1988 | Stewart | 326/30 |
| 5,029,287 A | 7/1991 | Felbaumer et al. | 326/30 |
| 5,107,230 A | 4/1992 | King | 326/86 |
| 5,239,658 A | 8/1993 | Yamamuro et al | |
| 5,274,671 A | 12/1993 | Johnson | |
| 5,382,841 A | 1/1995 | Feldbaumer | 326/30 |
| 5,440,248 A | 8/1995 | Brown et al. | 326/71 |
| 5,479,123 A | 12/1995 | Gist et al. | |
| 5,602,494 A | 2/1997 | Sundstrom | 326/86 |
| 5,731,711 A | 3/1998 | Gabara | 326/30 |
| 5,781,028 A | 7/1998 | Decuir | 326/30 |
| 6,023,175 A | * 2/2000 | Nunomiya et al. | 326/68 |

FOREIGN PATENT DOCUMENTS

| | | |
|---|---|---|
| EP | 575124 | 12/1993 |
| JP | 6-104725 | 4/1994 |

* cited by examiner

*Primary Examiner*—Michael Tolar
*Assistant Examiner*—Anh Q. Tran
(74) *Attorney, Agent, or Firm*—Arent Fox Kintner Plotkin & Kahn

(57) ABSTRACT

A system for signal transmission has at least one bus for the signal transmission and a reflection-prevention resistance provided on a stub connected to the bus for preventing reflection of signals at an intersection between the bus and the stub. The system includes termination resistances, and a switch unit for coupling the bus to termination voltage via the termination resistances in a first mode and for disconnecting the bus from the termination voltage in a second mode.

10 Claims, 20 Drawing Sheets

BUS CONFIGURATION AND INPUT/OUTPUT BUFFER

This application is a divisional application filed under 37 CFR § 1.53(b) of parent application Ser. No. 09/339,853, filed Jun. 25, 1999, now U.S. Pat. No. 6,154,047, which in turn is a divisional of application Ser. No. 08/754,760, filed Nov. 21, 1996, now U.S. Pat. No. 5,949,252.

BACKGROUND OF THE INVENTION

1. Field of the Invention

The present invention generally relates to an input/output interface between a plurality of integrated-circuit chips, and particularly relates to an input/output interface coping with both high-speed data transfer using high-frequency signals and low-speed data transfer using low-frequency signals.

2. Description of the Related Art

An increase in processing speed of microprocessors should be accompanied by an increase in data-transfer speed using signals of higher frequencies for data transfer between LSI chips. The TTL level and the CMOS level used as input/output levels in the related-art LSIs suffer from increasing effects of signal reflections and crosstalk when a signal frequency becomes as high as about 50 MHz. These effects make it difficult to conduct error-free data transfer.

In order to obviate this problem, various input/output interfaces such as CTT (center tapped termination) and GTL (Gunning transceiver logic) use signals of small amplitudes lower than 1V. These input/output interface schemes are not satisfactory enough, however, when frequency limits and chip-power consumption are considered.

In light of these, the inventor of the present invention has proposed high-speed and small-signal-amplitude interface standard SSTL (stub series terminated logic), which was adopted by JEDEC (a lower branch of the Electronics Industries Association in the United States) as an industry standard.

FIG. 1 is an illustrative drawing showing a bus configuration of SSTL.

As shown in FIG. 1, SSTL inserts resistance Rs between a bus 10 having a characteristic impedance $z_0$ and a stub (branch from the bus 10) 11 having a characteristic impedance $Z_1$. This resistance Rs has a resistance value related as:

$$z_0/2 + Rs = Z_1 \qquad (1)$$

In this case, a signal reflected at a device end and returning to the bus 10 will not be reflected again at the connection between the stub 11 and the bus 10, because impedance matching is in place between the stub 11 and a point beyond (bus 10). This prevents transient responses from interfering with transmitted signals, thereby achieving high-speed data transfer. SSTL also connects the bus 10 to the termination voltage Vtt via termination resistances Rt as shown in FIG. 1. The termination voltage Vtt is set lower than a power voltage level. Choice of an appropriate value for the termination resistance Rt can prevent signal reflections at the end points of the bus 10.

In practice, the termination voltage Vtt is substantially 1.5V, and a reference voltage Vref used in receivers (input units for receiving signals from the bus) is also substantially set to 1.5V. The termination resistance Rt is about 50 Ω, and the resistance Rs is approximately 25 Ω.

The SSTL described above can achieve high-speed data transfer, but has a problem in terms of power consumption. Personal computers and engineering workstations are generally provided with a function to reduce a clock frequency for power conservation. This function may be activated when no input entry from a keyboard is made for a predetermined time period. However, systems complying with the SSTL standard require input buffers for high-speed data transfer to be provided on the input side of devices, and these input buffers consume a large amount of power. On the side of the bus, also, the terminal resistances Rt consume power. These factors prevent the SSTL systems from achieving a sufficient reduction in power consumption even when the clock frequency is reduced.

Accordingly, an SSTL system needs an input/output interface and a bus configuration which achieve a sufficient reduction in power consumption by switching from a high-speed transfer mode to a low-speed transfer mode.

Considering the main objective of SSTL which is to achieve high-speed data transfer, it is desirable if high-speed characteristics of SSTL are further enhanced. This may be achieved by incorporating into chips used in SSTL systems some features which can enhance the high-speed characteristics of the system. It is preferable, however, to be able to use the same chips in LVTTL systems as well as in SSTL systems, in consideration of the diversity of chip usage.

In general, chips for SSTL are usable in LVTTL without any change. Namely, these chips can be built in a low-speed system using LVTTL, and, at the same time, can be built in a high-speed system using SSTL. If such features as enhancing the high-speed characteristics of SSTL are incorporated into these chips by specializing the chips, these chips may not be usable in LVTTL systems.

Accordingly, it is desirable to have an input/output interface which enhances the high-speed characteristics of SSTL and is usable in LVTTL systems, and a chip having such an input/output interface.

Accordingly, there is a need in SSTL for an input/output interface and a bus configuration which can achieve a sufficient reduction in power consumption by switching from a high-speed transfer mode to a low-speed transfer mode.

Also, there are needs for an input/output interface which can enhance the high-speed characteristics of SSTL and yet be usable in LVTTL systems, and for a chip having such an input/output interface.

SUMMARY OF THE INVENTION

Accordingly, it is a general object of the present invention to provide an input/output interface and a chip which can satisfy the needs described above.

It is another and more specific object of the present invention to provide a bus configuration which can achieve a sufficient reduction in power consumption by switching from a high-speed transfer mode to a low-speed transfer mode.

In order to achieve the above objects according to the present invention, a system for signal transmission has at least one bus for the signal transmission and a reflection-prevention resistance provided on a stub connected to the bus for preventing reflection of signals at an intersection between the bus and the stub. The system includes termination resistances, and a switch unit for coupling the bus to termination voltage via the termination resistances in a first mode and for disconnecting the bus from the termination voltage in a second mode.

In the system described above, the bus used in an SSTL system is disconnected from the termination voltage by the switch unit, thereby achieving a sufficient reduction in power consumption when switching from the high-speed transfer mode to the low-speed transfer mode.

It is still another object of the present invention to provide an input/output interface which can achieve a sufficient reduction in power consumption by switching from a high-speed transfer mode to a low-speed transfer mode.

In order to achieve the above object according to the present invention, an input buffer circuit connected to a bus for receiving signals from the bus includes a first buffer receiving the signals, the first buffer operating in a first mode in which the signals are transmitted on the bus through a first frequency, a second buffer receiving the signals, the second buffer operating in a second mode in which the signals are transmitted on the bus through a second frequency lower than the first frequency, and a unit for providing one of an output of the first buffer and an output of the second buffer to an internal circuit, wherein power consumption of the second buffer during operation thereof is lower than power consumption of the first buffer during operation thereof.

The input buffer circuit described above has the first buffer operating during the high-speed transfer mode and the second buffer operating during the low-speed transfer mode, and the second buffer has a power consumption rate lower than that of the first buffer. Therefore, a switch from the high-speed transfer mode to the low-speed transfer mode can achieve a sufficient cut in the power consumption.

It is yet another object of the present invention to provide an input/output interface which can enhance the high-speed characteristics of SSTL and yet is usable in LVTTL systems.

In order to achieve the above object, an output buffer for transmitting signals to a bus according to the present invention is built in a device connected to the bus. The output buffer includes a first buffer outputting the signals to the bus, a second buffer outputting the signals to the bus, the second buffer being in parallel connection with the first buffer and having a smaller driving power for transmitting the signals than the first buffer, and a power switching unit for switching between a first mode to drive the first buffer and a second mode to drive the second buffer, wherein the first mode is used when the device is incorporated into a system having termination resistances connecting the bus to termination voltage and a reflection-prevention resistance provided on a stub connected to the bus for preventing reflection of the signals at an intersection between the bus and the stub, and the second mode is used when the device is incorporated into a system having no termination resistances.

The output buffer described above boosts the high-speed characteristics of SSTL when used in an SSTL system by transmitting signals by using a greater driving power, but transmits signals by using the smaller driving power so as to be usable also in an LVTTL system.

It is yet another object of the present invention to provide a chip having the above-mentioned input/output interface.

In order to achieve the above object, a device according to the present invention connected to a bus for signal transmission includes a first buffer outputting the signals to the bus, a second buffer outputting the signals to the bus, the second buffer being in parallel connection with the first buffer and having a smaller driving power for transmitting the signals than the first buffer, and a power switching unit for switching between a first mode to drive the first buffer and a second mode to drive the second buffer, wherein the first mode is used when the device is incorporated into a system having termination resistances connecting the bus to termination voltage and a reflection-prevention resistance provided on a stub connected to the bus for preventing reflection of the signals at an intersection between the bus and the stub, and the second mode is used when the device is incorporated into a system having no termination resistances.

The device chip described above boosts the high-speed characteristics of SSTL when used in an SSTL system by transmitting signals by using a greater driving power, but also transmits signals by using the smaller driving power so as to be usable in a LVTTL system.

Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings.

Figure 2:
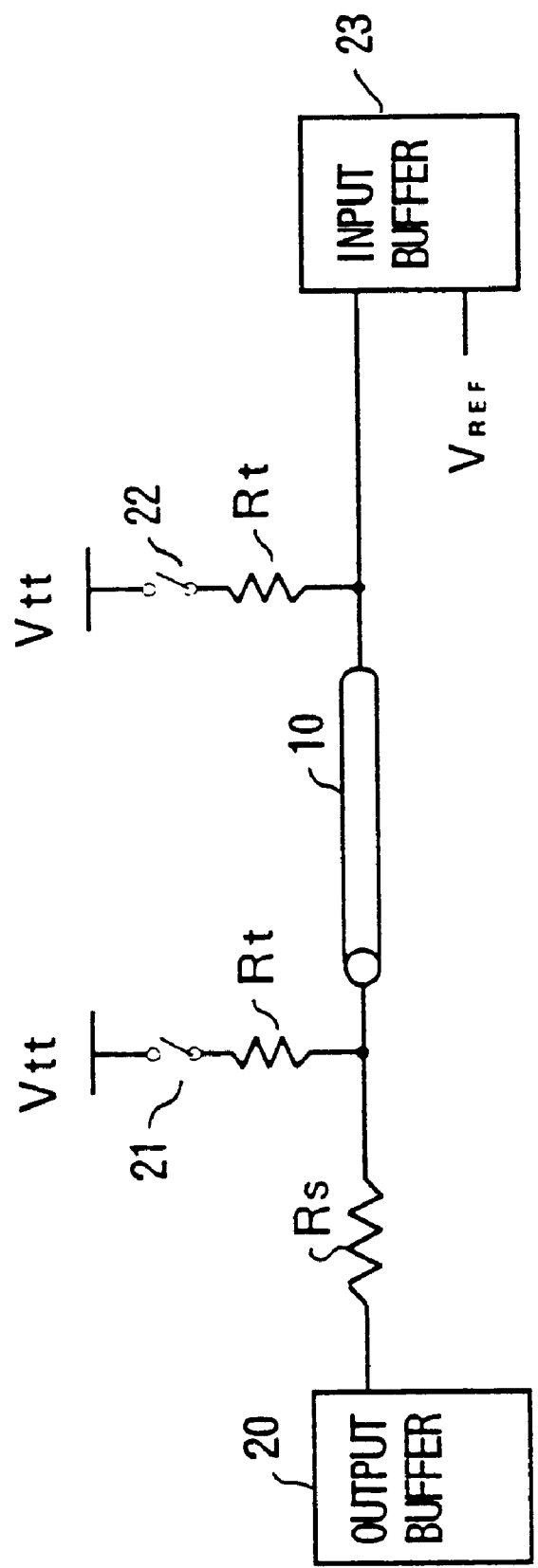
FIG. 2 is an illustrative drawing showing a bus configuration according to a first principle of the present invention.

FIG. 2 is an illustrative drawing showing a bus configuration according to a first principle of the present invention. The bus configuration of FIG. 2 includes a bus 10, an output buffer 20, a resistance Rs connecting the output buffer 20 to the bus 10, termination resistances Rt connecting the bus 10 to a termination voltage Vtt, switch means 21 and 22, and an input buffer 23. Signals are transmitted from the output buffer 20 to the input buffer 23 via the bus 10. The input buffer 23 is provided with a reference voltage Vref, and compares an input signal voltage with the reference voltage Vref to determine high/low of-the input signal. The switch means 21 and 22 are provided with control signals (see FIG. 2), which control the switching of the switch means 21 and 22.

In a high-speed (high-power-consumption) mode, the switch means 21 and 22 are closed by the control signals, so that the bus configuration of FIG. 2 is equivalent to that of SSTL. This configuration suppresses signal reflections, thereby effecting high-speed data transfer using high-frequency signals. Since the bus 10 is connected to the termination voltage Vtt via the termination resistances Rt, signals propagating via the bus 10 has a relatively small amplitude.

In a low-speed (low-power-consumption) mode, the switch means 21 and 22 are opened by the control signals, so that the bus 10 is disconnected from the termination voltage Vtt. As a result, the bus configuration of FIG. 2 is similar to that of LVTTL in this case. Namely, the bus configuration of FIG. 2 is equivalent to that of LVTTL, except for the inserted resistance Rs. Since the termination voltage Vtt is not applied, the termination resistances Rt are functionally non-existent. Signals transmitted via the bus 10 in this case have an amplitude larger than that of the high-speed mode. Also, power consumption at the termination resistances Rt is zero, so that power consumption can be reduced from the case of the high-speed mode. Further, signal transmission using a reduced signal frequency (clock frequency) and an increased amplitude can cut down power consumption in various parts of the system.

Figure 3:
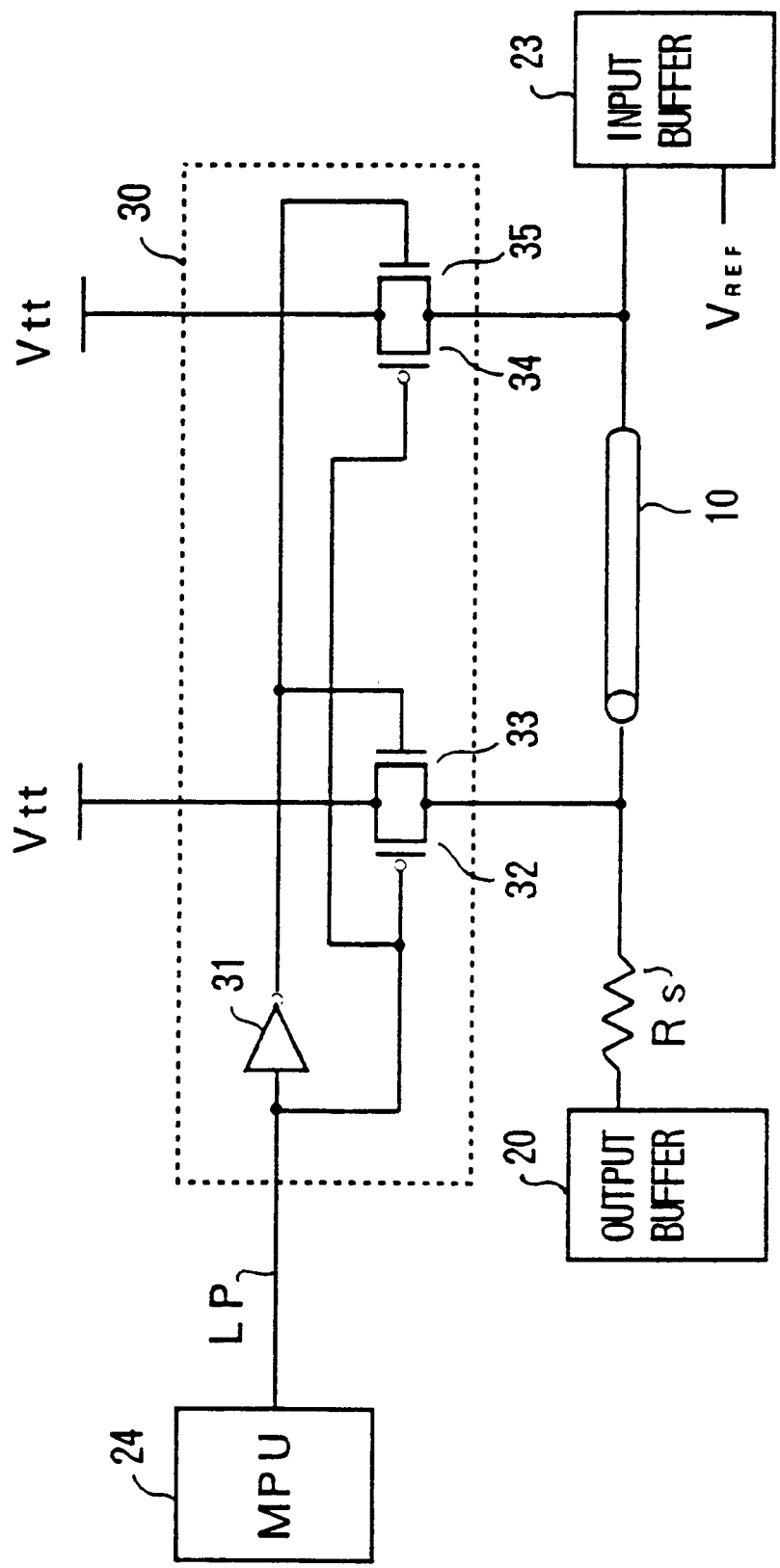
FIG. 3 is an illustrative drawing showing a signal-transmission system according an embodiment of the first principle of the present invention.

FIG. 3 is an illustrative drawing showing a signal-transmission system according to an embodiment of the first principle of the present invention. In FIG. 3, the same elements as those of FIG. 2 are referred to by the same numerals, and a description thereof will be omitted.

The signal-transmission system of FIG. 3 includes the bus 10, the output buffer 20, the input buffer 23, the resistance Rs, an MPU 24, and a terminator unit 30. The terminator unit 30 includes an inverter 31, a PMOS transistor 32, an NMOS transistor 33, a PMOS transistor 34, and an NMOS transistor 35. The PMOS transistor 32 and the NMOS transistor 33 correspond to the switch means 21 and the pertinent termination resistance Rt of FIG. 2, and the PMOS transistor 34 and the NMOS transistor 35 correspond to the switch means 22 and the pertinent termination resistance Rt of FIG. 2. A pair of the PMOS transistor 32 and the NMOS transistor 33 has an on/off function, and serves as the termination resistance Rt by providing an internal resistance of about 50 Ω. The same applies with regard to a pair of the PMOS transistor 34 and the NMOS transistor 35. Here, a pair of a PMOS transistor and an NMOS transistor is used for the purpose of suppressing non-linearity of internal resistances. This embodiment employs a CMOS type consisting of a PMOS transistor and an NMOS transistor, but the same effect can be achieved by using a pair of an NMOS transistor and another NMOS transistor. Such a relation between an NMOS transistor and a CMOS is well known.

The input buffer 23 supplies a control signal LP to the terminator unit 30. The control signal LP is set to LOW (logical level 0) in the high-speed mode and HIGH (logical level 1) in the low-speed mode.

The control signal LP at LOW turns the PMOS transistor 32 and the PMOS transistor 34 on. Since an output of the inverter 31 becomes HIGH, the NMOS transistor 33 and the NMOS transistor 35 are also turned on. The bus 10 is thus connected to the termination voltage Vtt via the termination resistances Rt. In this case, the signal-transmission system of FIG. 3 has a configuration complying with the SSTL standards, thereby conducting transmission of small-amplitude and high-frequency signals.

The control signal LP at HIGH turns the PMOS transistor 32 and the PMOS transistor 34 off. Since the output of the inverter 31 becomes LOW, the NMOS transistor 33 and the NMOS transistor 35 are also turned off. The bus 10 is thus disconnected from the termination voltage Vtt. In this case, the signal-transmission system of FIG. 3 has a configuration similar to that of LVTTL, thereby conducting transmission of large-amplitude and low-frequency signals. This is a system of low transmission speed and low power consumption.

FIG. 3 shows only one bus line for simplicity of explanation, but the number of bus lines may be close to 100. A large number of bus lines means a large number of terminal resistances, so that an input capacitance of a node for the control signal LP is increased for the MPU 24. Then, the MPU 24 may fail to achieve instant switching between the low-speed (low-power-consumption) mode and the high-speed (high-power-consumption) mode. For instant switching between these two modes, a procedure described below is used in this embodiment.

Figure 4:
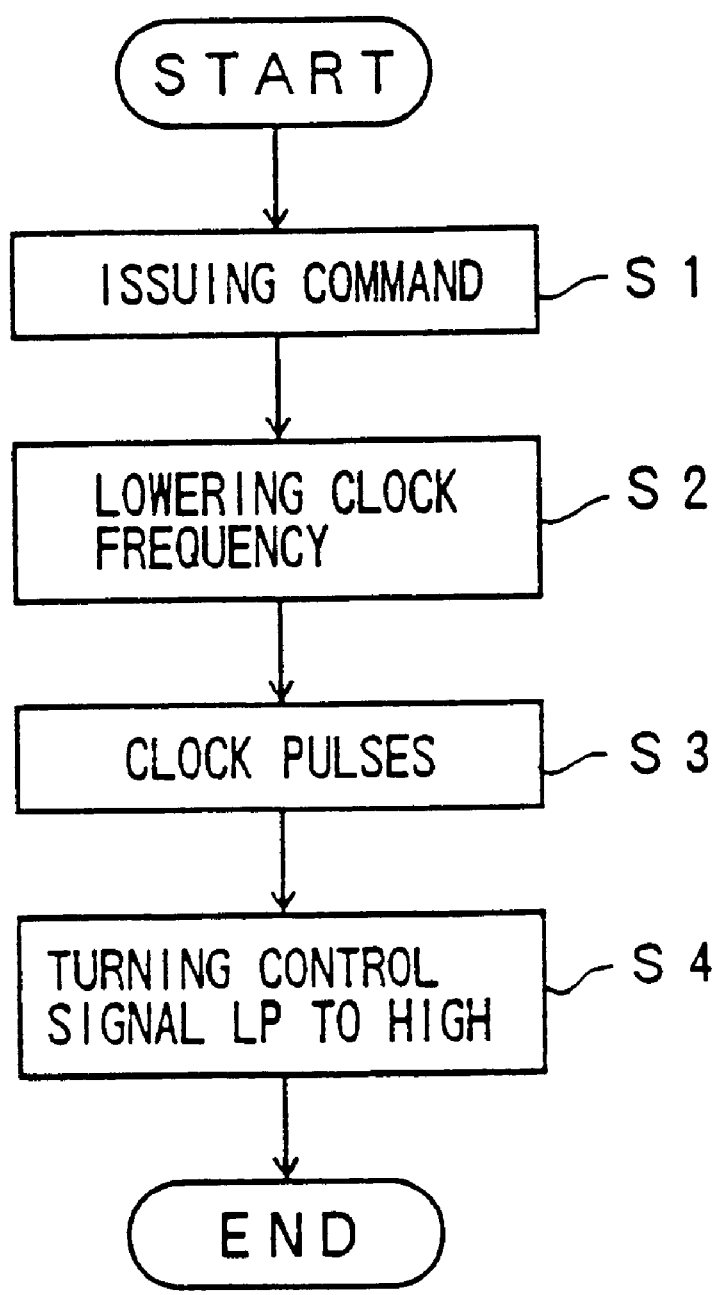
FIG. 4 is a flowchart of a control procedure for switching from a high-speed (high-power-consumption) mode to a low-speed (low-power-consumption) mode.

FIG. 4 is a flowchart of a control procedure for switching from the high-speed (high-power-consumption) mode to the low-speed (low-power-consumption) mode.

At step S1, the MPU issues a command for switching to the low-speed mode.

At step S2, a clock frequency is decreased in response to the command. The clock frequency is reduced to a level at which the system is operable without termination resistances.

At step S3, clock pulses are allowed to pass just for the sake of passing time until the system becomes stable at the reduced clock frequency.

At step S4, the control signal LP is turned to HIGH. Pairs of the PMOS transistor and the NMOS transistor (see FIG. 3) are turned off, so that a signal amplitude on the bus is enlarged. When viewed in a short time range, the turning off of the transistor pairs is not instantly completed, but is effected as a gradual increase of the resistance. Thus, the increase in the amplitude of signals on the bus is also gradual.

Figure 5:
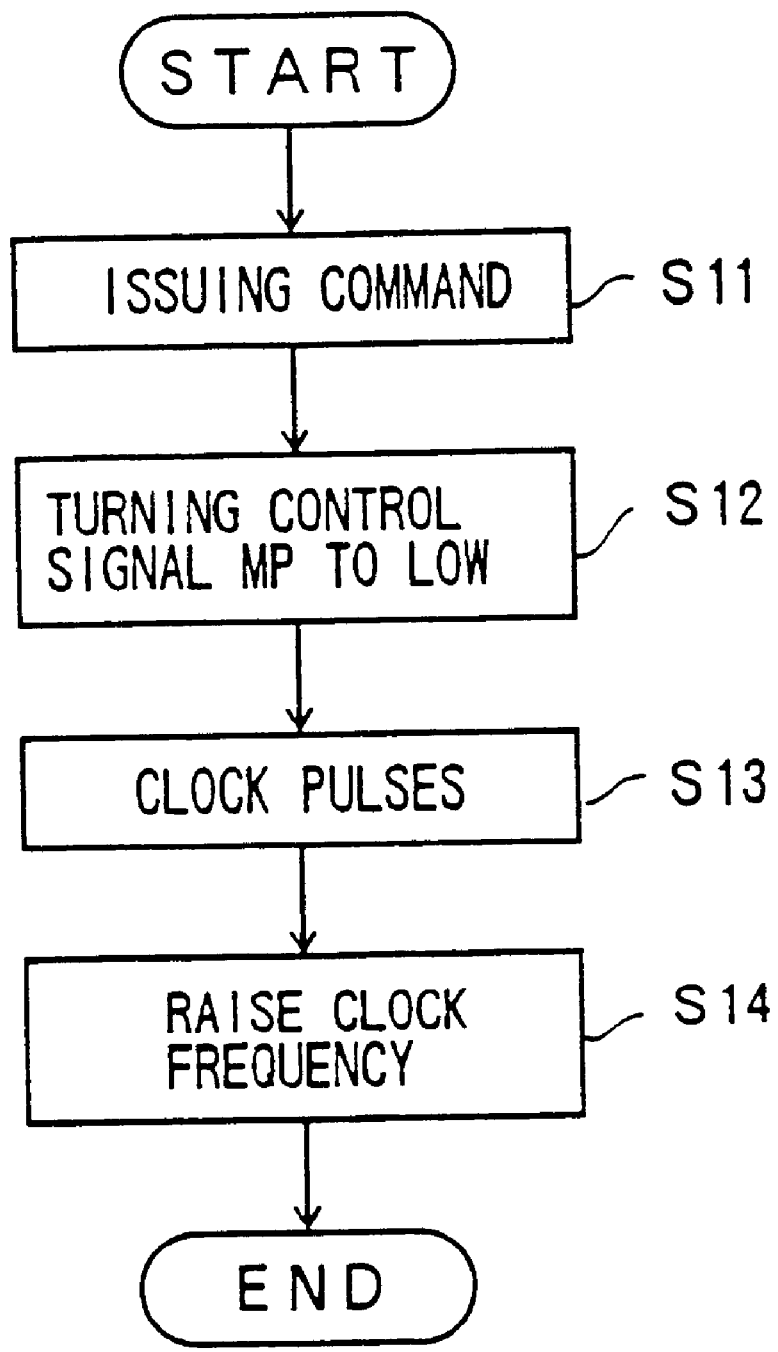
FIG. 5 is a flowchart of a control procedure for switching from the low-speed (low-power-consumption) mode to the high-speed (high-power-consumption) mode.

FIG. 5 is a flowchart of a control procedure for switching from the low-speed (low-power-consumption) mode to the high-speed (high-power-consumption) mode.

At step S1, the MPU issues a command for switching to the high-speed mode.

At step S12, the control signal LP is turned to LOW. Pairs of the PMOS transistor and the NMOS transistor (see FIG. 3) are turned on, so that a signal amplitude on the bus is decreased. When viewed in a short time range, the turning on of the transistor pairs is not instantly completed, but is effected as a gradual decrease of the resistance. Thus, the decrease in the amplitude of signals on the bus is also gradual.

At step S13, clock pulses are allowed to pass just for the sake of passing time until the signal amplitude becomes stable on the bus.

At step S14, the clock frequency is raised.

The system of FIG. 2 is set to start in either the high-speed mode or the low-speed mode when the system is powered on.

Figure 6A:
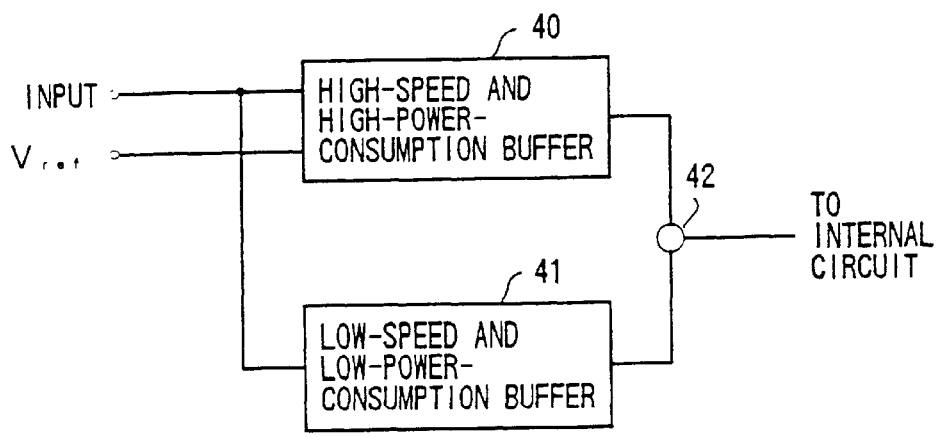
FIGS. 6A and 6B are block diagrams of input buffer units according to a second principle of the present invention.
Figure 6B:
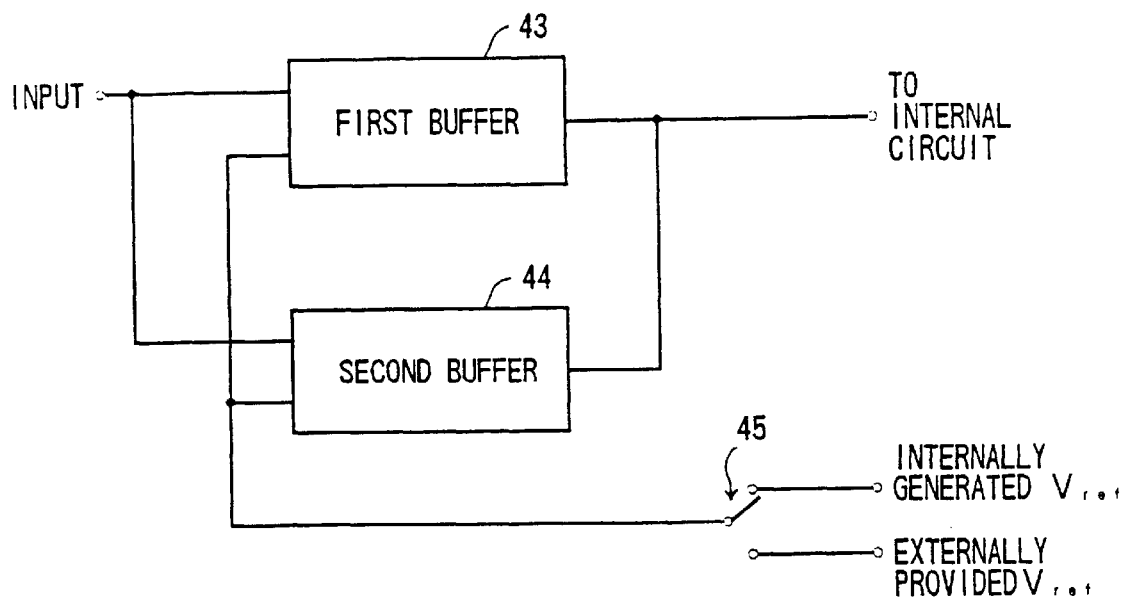

FIGS. 6A and 6B are block diagrams of input buffer units according to a second principle of the present invention. These input buffer units have such a configuration that can cope with both the low-speed (low-power-consumption) mode and the high-speed (high-power-consumption) mode.

The input buffer unit of FIG. 6A includes a high-speed and high-power-consumption buffer 40, a low-speed and low-power-consumption buffer 41, and signal connecting means 42.

The high-speed and high-power-consumption buffer 40 is a differential-input-type amplifier generally used in the field, and receives the reference voltage Vref to compare an input signal with the reference voltage Vref. The high-speed and high-power-consumption buffer 40 outputs a HIGH signal if the input signal is larger than the reference voltage Vref, and outputs a LOW signal if the input signal is lower than the reference voltage Vref. The high-speed and high-power-consumption buffer 40 also receives the control signal LP, and operates only when the control signal LP is LOW.

The low-speed and low-power-consumption buffer 41 is a CMOS buffer generally used in the field. The low-speed and low-power-consumption buffer 41 receives the control signal LP, and operates only when the control signal LP is HIGH.

The signal connecting means 42 supplies the signal either from the high-speed and high-power-consumption buffer 40 or from the low-speed and low-power-consumption buffer 41 to internal circuits.

In the high-speed (high-power-consumption) mode, the control signal LP is set to LOW. The high-speed and high-power-consumption buffer 40 is used in this case, and data of high-frequency signals are supplied to the internal circuits at high speed. In the low-speed (low-power-consumption) mode, the control signal LP is set to HIGH. The low-speed and low-power-consumption buffer 41 is used in this case, and data of low-frequency signals is supplied to internal circuits without excessive power consumption.

FIG. 6B shows a variation of the input buffer according to the second principle of the present invention. The input buffer of FIG. 6B includes a first buffer 43, a second buffer 44, and switch means 45.

The first buffer 43 and the second buffer 44 are a differential-input-type amplifier. MOS transistors of the first buffer 43 have a wider gate width compared to those used in the second buffer 44. The gate width of the MOS transistors used in the first buffer 43 is five times as wide as those of the second buffer 44, for example. The control signal LP is supplied to the first buffer 43 to control it to be active or inactive. In detail, the control signal LP is LOW in the high-speed mode to activate the first buffer 43, and is HIGH in the low-speed mode to halt the first buffer 43.

In the high-speed mode, the first buffer 43 and the second buffer 44 operate in parallel. For the sake of explanation, the gate width of the second buffer 44 is called a basic gate width. If the gate width of the first buffer 43 is five times wider than the basic gate width, the first buffer 43 and the second buffer 44 will make up an input buffer having a gate width six times wider than the basic gate width. The input buffer with this gate width has a short response time for input signals, thereby allowing input of high-frequency signals. This input buffer, however, consumes six times as much power as the second buffer 44.

In the low-speed mode, only the second buffer 44 operates. Since a gate width in this case is one-sixth of that of the high-speed mode, a response time for input signals is slow, so that only low-frequency signals are allowed to be input. In this case, however, power consumption is one-sixth of that of the high-speed mode.

The switch means 45 under the control of the control signal LP supplies an externally provided reference voltage Vref in the high-speed mode, and supplies an internally generated reference voltage Vref in the low-speed mode. The reference voltage Vref, however, can be externally provided both in the high-speed mode and the low-speed mode. The switch means 45 is not an essential part in the second principle of the present invention, but is shown as an example of means for supplying the reference voltage Vref.

According to the input buffer unit of the second principle of the present invention, the high-power-consumption buffer suitable for high-speed data transfer and the low-power-consumption buffer limited by a low-speed-data-transfer capacity are switched therebetween according to the control signal. This input buffer can be used in systems complying with the SSTL standard to reduce power consumption when switched to the low-speed mode. The control signal is provided from the external processor. For receiving the control signal, a control-signal input node may be provided. If a chip is a DRAM or the like, a command may be written in a mode register so that the mode register can supply the control signal to the internal circuits of the chip.

Figure 7:
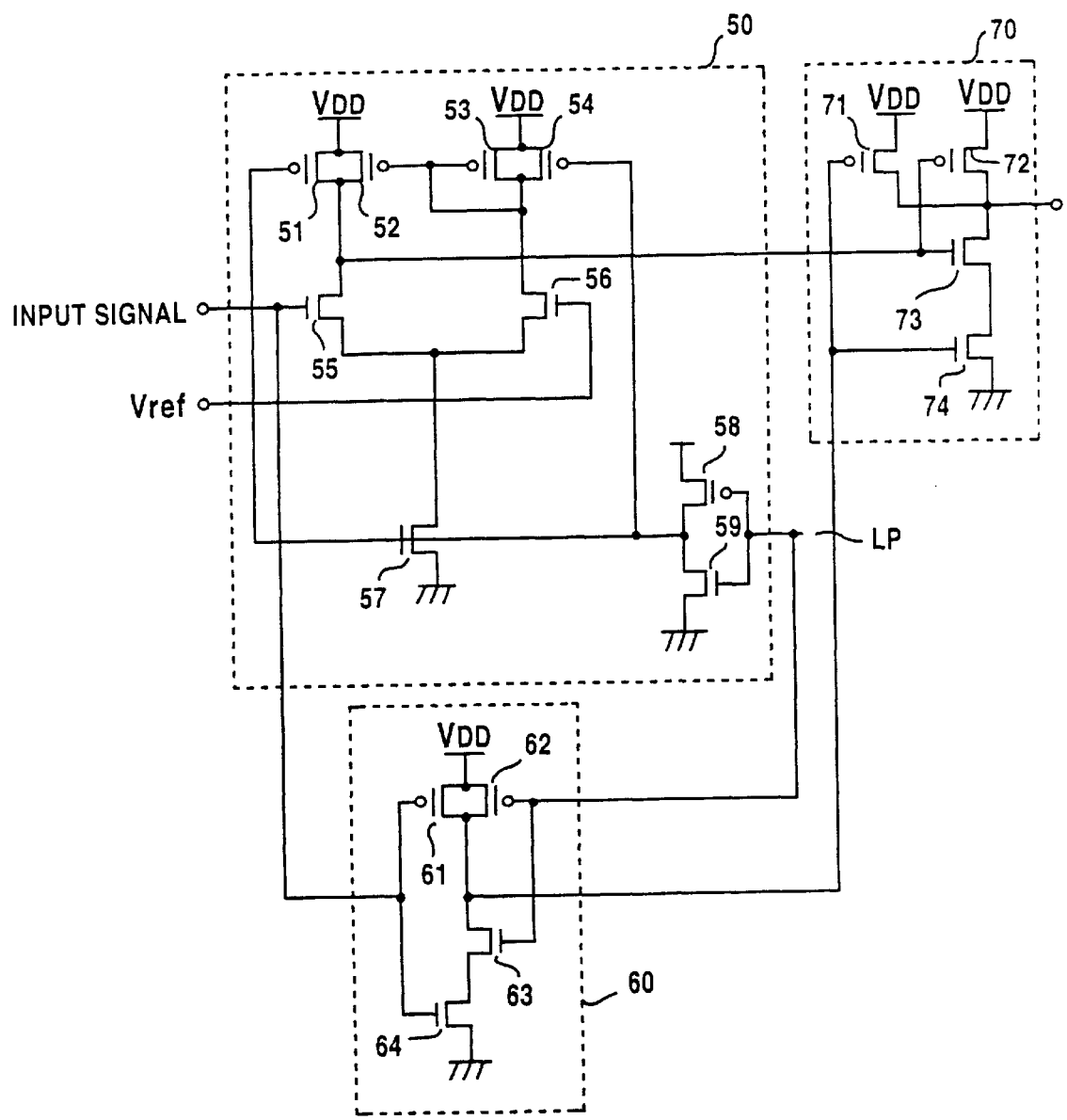
FIG. 7 is a circuit diagram of a first embodiment of an input buffer unit according to the second principle of the present invention.

FIG. 7 is a circuit diagram of a first embodiment of an input buffer unit according to the second principle of the present invention. The input buffer unit of FIG. 7 corresponds to that of FIG. 6A.

The input buffer unit of FIG. 7 includes a high-speed and high-power-consumption buffer 50, a low-speed and low-power-consumption buffer 60, and a signal connecting unit 70.

The high-speed and high-power-consumption buffer 50 includes PMOS transistors 51 through 54, NMOS transistors 55 through 57, a PMOS transistor 58, and an NMOS transistor 59. The PMOS transistor 58 and the NMOS transistor 59 form an inverter, which inverts the control signal LP to obtain an inverse control signal /LP (the symbol "/" hereinafter indicates inverse). The PMOS transistors 52 and 53 and the NMOS transistors 55 through 57 make up a differential amplifier. The differential amplifier is controlled as to whether or not it operates by the inverse control signal /LP, which is applied to the PMOS transistors 51 and 54 and the NMOS transistor 57.

In the high-speed mode, the control signal LP is LOW, and the inverse control signal /LP is HIGH. This inverse control signal /LP turns the PMOS transistors 51 and 54 off, and turns the NMOS transistor 57 on. The differential amplifier compares an input signal applied to the gate of the NMOS transistor 55 with the reference voltage Vref applied to the gate of the NMOS transistor 56. If the input signal has a voltage higher than the reference voltage Vref, the high-speed and high-power-consumption buffer 50 outputs a LOW signal. If the input signal has a voltage lower than the reference voltage Vref, the high-speed and high-power-consumption buffer 50 outputs a HIGH signal.

In the low-speed mode, the control signal LP is HIGH, and the inverse control signal/LP is LOW. This inverse control signal/LP turns the PMOS transistors 51 and 54 on, and turns the NMOS transistor 57 off. The high-speed and high-power-consumption buffer 50 thus outputs a HIGH signal at all times.

The low-speed and low-power-consumption buffer 60 includes PMOS transistors 61 and 62 and NMOS transistors 63 and 64. The PMOS transistors 61 and 62 and the NMOS transistors 63 and 64 form a NAND circuit receiving the control signal LP and the input signal.

In the high-speed mode, the control signal LP is LOW. This control signal LP turns the PMOS transistor 62 on, and turns the NMOS transistor 63 off. The low-speed and low-power-consumption buffer 60 in this case outputs a HIGH signal at all times.

In the low-speed mode, the control signal LP is HIGH. With this control signal LP, the NAND circuit comprising the PMOS transistors 61 and 62 and the NMOS transistors 63 and 64 operates as an inverter for inverting the input signal. The low-speed and low-power-consumption buffer 60 in this case outputs an inverse signal of the input signal.

The signal connecting unit 70 includes PMOS transistors 71 and 72 and NMOS transistors 73 and 74. The PMOS transistors 71 and 72 and the NMOS transistors 73 and 74 constitute a NAND circuit. In either the high-speed mode or the low-speed mode, an inactive one of the high-speed and high-power-consumption buffer 50 and the low-speed and low-power-consumption buffer 60 provides the HIGH signal at all times. One of these buffers which is active provides an inverse of the input signal. The signal connecting unit 70 thus generates an output which is the same as the input signal, by inverting the inverse input signal. The signal connecting unit 70 supplies this input signal to the internal circuits.

Figure 8:
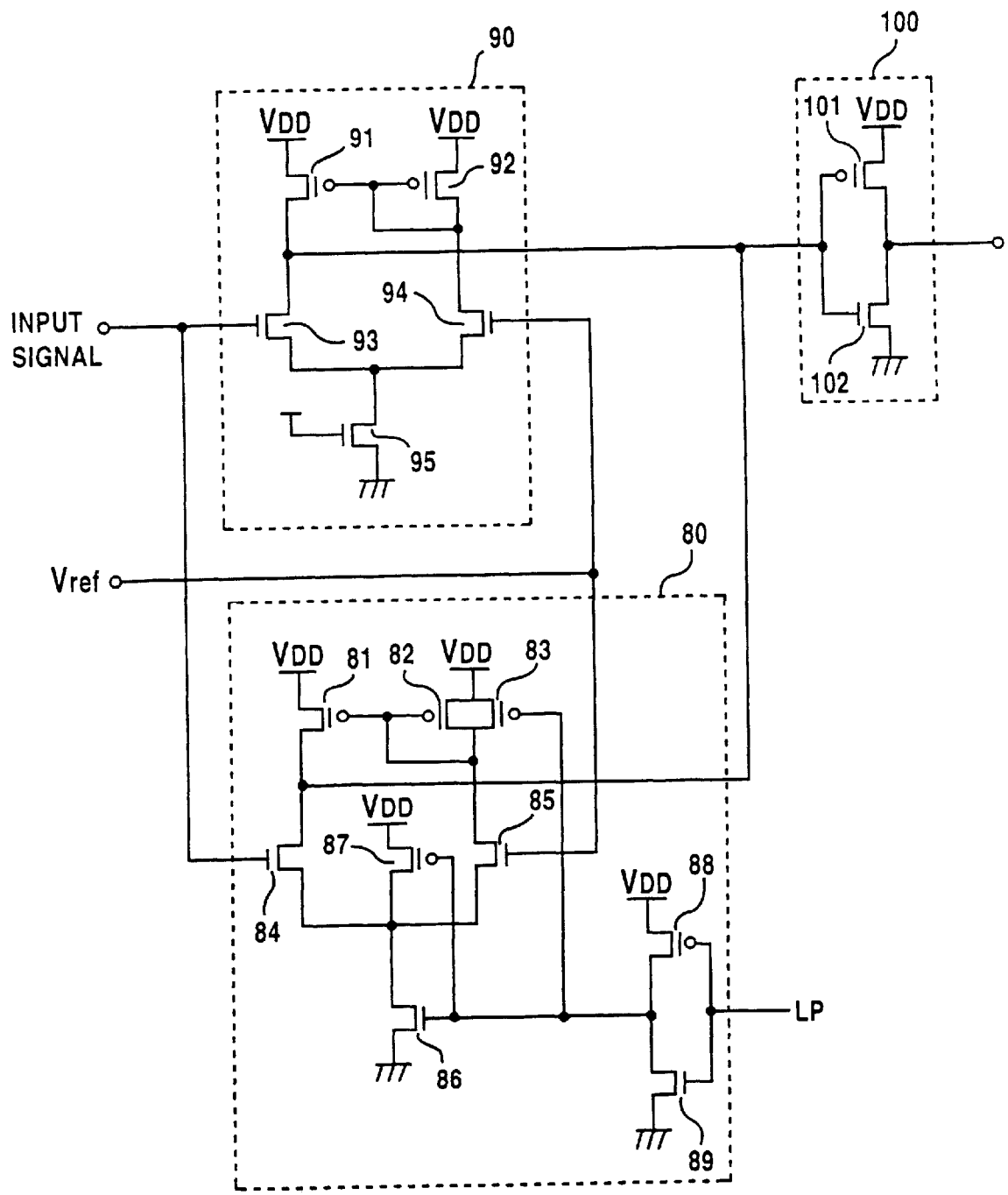
FIG. 8 is a circuit diagram of a second embodiment of an input buffer unit according to the second principle of the present invention.

FIG. 8 is a circuit diagram of a second embodiment of an input buffer unit according to the second principle of the present invention. The input buffer unit of FIG. 8 corresponds to that of FIG. 6B.

The input buffer unit of FIG. 8 includes a first buffer 80, a second buffer 90, and an inverter 100.

The first buffer 80 includes PMOS transistors 81 through 83, NMOS transistors 84 through 86, PMOS transistors 87 and 88, and an NMOS transistor 89. The PMOS transistor 88 and the NMOS transistor 89 form an inverter, which inverts the control signal LP to generate an inverse control signal/LP. The PMOS transistors 81 and 82 and the NMOS transistors 84 through 86 make up a differential amplifier. On/off of the differential amplifier is controlled by the inverse control signal/LP which is applied to the PMOS transistors 83 and 87.

In the high-speed mode, the control signal LP is LOW, and the inverse control signal/LP is HIGH. In this case, the PMOS transistors 83 and 87 are turned off, and the NMOS transistors 84 through 86 are turned on. As a result, the PMOS transistors 81 and 82 and the NMOS transistors 84 through 86 collectively operate as the differential amplifier. The differential amplifier compares an input signal applied to the gate of the NMOS transistor 84 with the reference voltage Vref applied to the gate of the NMOS transistor 85. If the input signal has a voltage higher than the reference voltage Vref, the first buffer 80 outputs a LOW signal. If the input signal has a voltage lower than the reference voltage Vref, the first buffer 80 outputs a HIGH signal.

In the low-speed mode, the control signal LP is HIGH, and the inverse control signal/LP is LOW. This inverse control signal/LP turns the PMOS transistors 83 and 87 on, and turns the NMOS transistor 86 off. Also, the PMOS transistor 81 is turned off. Since the PMOS transistor 87 is on, the NMOS transistor 84 is off regardless of the input signal. As a result, the first buffer 80 has an output which is floated (not connected to any voltage) at all times.

The second buffer 90 includes PMOS transistors 91 and 92 and NMOS transistors 93 through 95. These transistors make up a differential amplifier. Regardless of the operation mode, the second buffer 90 outputs a LOW signal if the input signal has a voltage higher than the reference voltage Vref. The input signal's voltage lower than the reference voltage Vref results in the second buffer 90 outputting a HIGH signal.

The inverter 100 includes a PMOS transistor 101 and an NMOS transistor 102. In the high-speed mode, both the first buffer 80 and the second buffer 90 operate to supply an inverse of the input signal. The inverter 100 thus produces an output which is returned to the input signal by inverting the inverse of the input signal. In the low-speed mode, the first buffer 80 has a floating output, which can be ignored. The inverter 100 thus outputs the input signal which is obtained by inverting the output signal of the second buffer 90.

Figure 9:
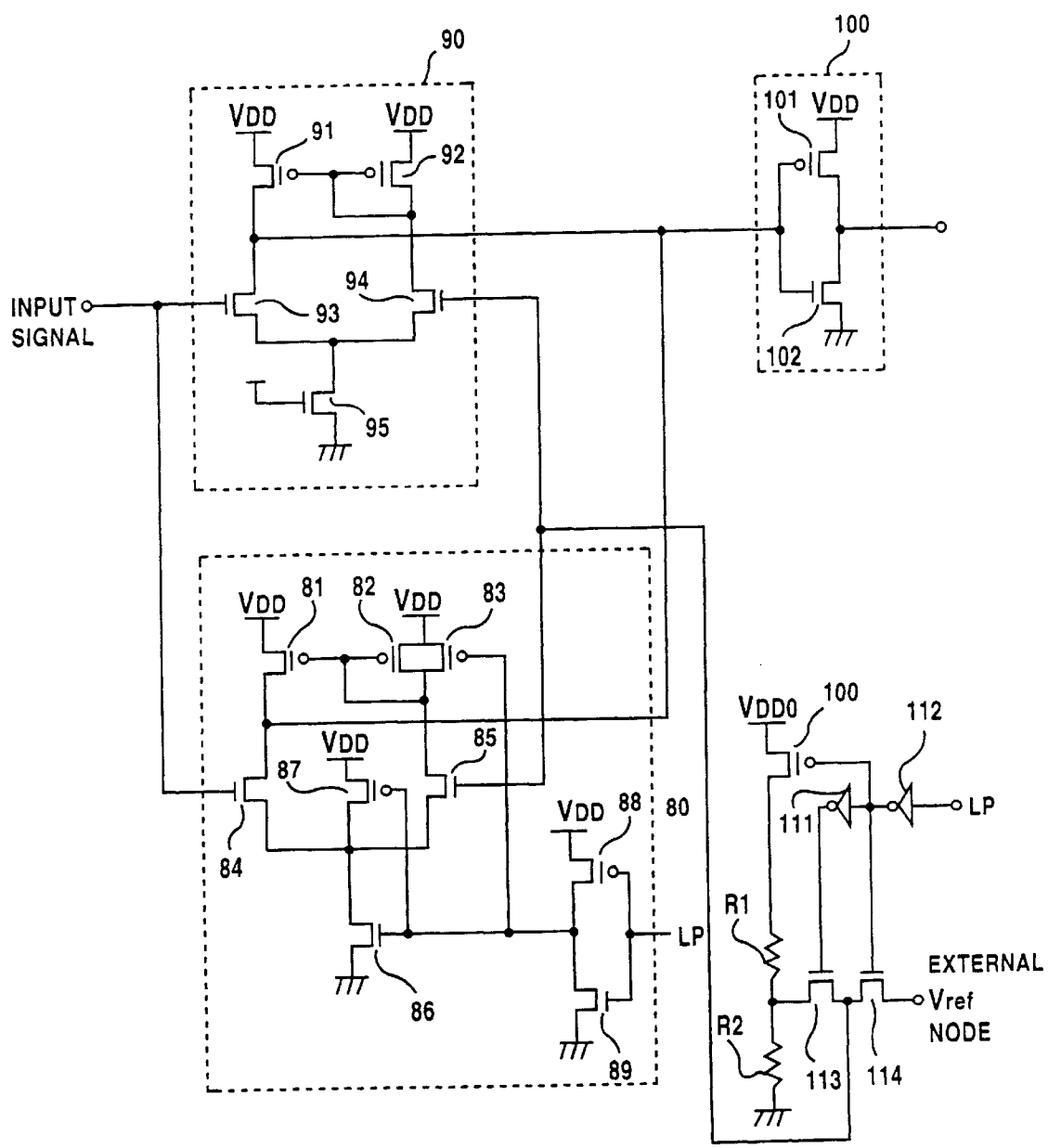
FIG. 9 is a circuit diagram of a third embodiment of an input buffer unit according to the second principle of the present invention.

FIG. 9 is a circuit diagram of a third embodiment of an input buffer unit according to the second principle of the present invention. The input buffer unit of FIG. 9 corresponds to that of FIG. 6B. In FIG. 9, the same elements as those of FIG. 8 are referred to by the same numerals, and a description thereof will be omitted.

The input buffer unit of FIG. 9 includes the first buffer 80, the second buffer 90, and the inverter 100 as does the input buffer unit of FIG. 8. In FIG. 9, the reference voltage Vref supplied to the input buffer unit of the third embodiment is internally generated in the low-speed mode within the chip having the input buffer unit of FIG. 9. The reference-voltage switching/generating unit for this purpose includes a PMOS transistor 110, inverters 111 and 112, NMOS transistors 113 and 114, and resistances R1 and R2.

The control signal LP is input to the inverter 112, whose output is supplied to the gate of the PMOS transistor 110, the input of the inverter 111, and the gate of the NMOS transistor 114. The output of the inverter 111 is supplied to the gate of the NMOS transistor 113. The NMOS transistors 113 and 114 are connected in series, with the external reference voltage Vref applied to the drain of the NMOS transistor 114, and a point between the resistances R1 and R2, connected in series, i, coupled to the drain of the NMOS transistor 113. The drain of the PMOS transistor 110 is connected to a series of the resistances R1 and R2 on the side of the resistance R1, and the resistance R2 is coupled to the ground.

In the high-speed mode, the control signal LP is LOW, and the output of the inverter 112 is HIGH. This inverter output turns the PMOS transistor 110 off, and turns the NMOS transistor 114 on. The inverter 111 in this case outputs LOW, so that the NMOS transistor 113 is turned off. The external reference voltage Vref is thus supplied to the first buffer 80 and the second buffer 90.

Since the PMOS transistor 110 is off in this case, an electric current is not wasted by flowing through the resistances R1 and R2, thereby conserving power consumption.

In the low-speed mode, the control signal LP is HIGH, and the output of the inverter 112 is LOW. This inverter output turns the PMOS transistor 110 on, so that a current flows through the resistances R1 and R2 to generate the reference voltage Vref at a connecting point between the resistances R1 and R2. The output of the inverter 111 is turned to HIGH, turning the NMOS transistor 113 on. The internally generated reference voltage Vref is thus supplied to the first buffer 80 and the second buffer 90.

Figure 10:
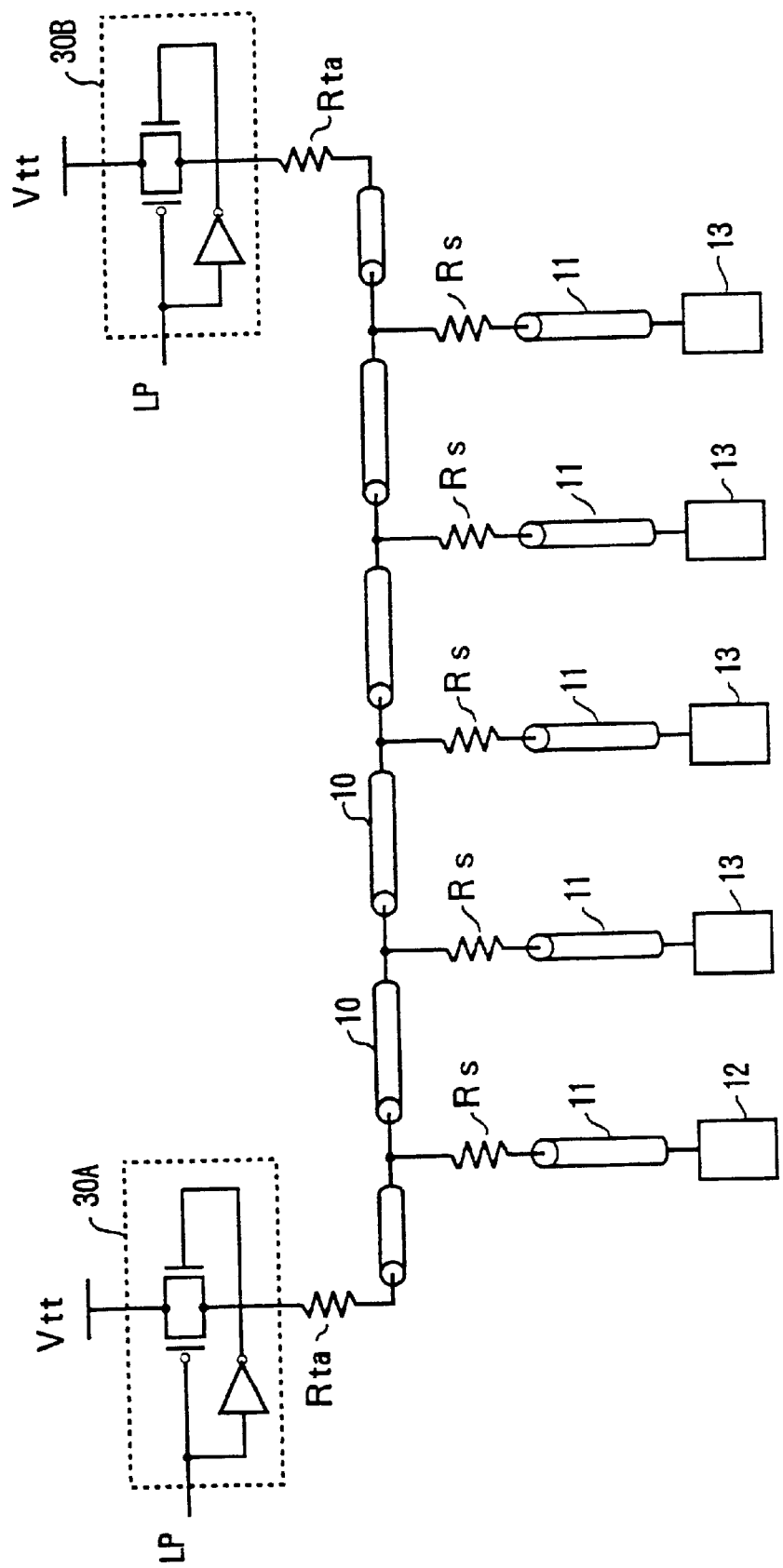
FIG. 10 is an illustrative drawing showing an exemplary system using the bus configuration according to the first principle of the present invention and input buffers according to the second principle of the present invention.

FIG. 10 is an illustrative drawing showing an exemplary system using the bus configuration according to the first principle of the present invention and input buffers according to the second principle of the present invention. In FIG. 10, the same elements as those of FIG. 3 are referred to by the same numerals, and a description thereof will be omitted.

The system of FIG. 10 includes terminator units 30A and 30B, termination resistances Rta, the bus 10, a plurality of stubs 11, resistances Rs each inserted between a stub 11 and the bus 10, a driver 12, and memories 13. The driver 12 and the memories 13 are connected to the stubs 11. The terminator units 30A and 30B of FIG. 10 are the same as the terminator unit 30 of FIG. 3, except that the terminator unit 30 is divided into two parts in FIG. 10, and a description thereof will be omitted. In this example, the termination resistances Rta are connected between the bus 10 and the terminator units 30A and 30B, respectively. In this manner, not only the internal resistances of the transistors of the terminator units but also the termination resistances Rta in combination with the internal resistances may be used for forming total termination resistances. In FIG. 10, the control signal LP is provided from a processor (not shown).

Figure 11:
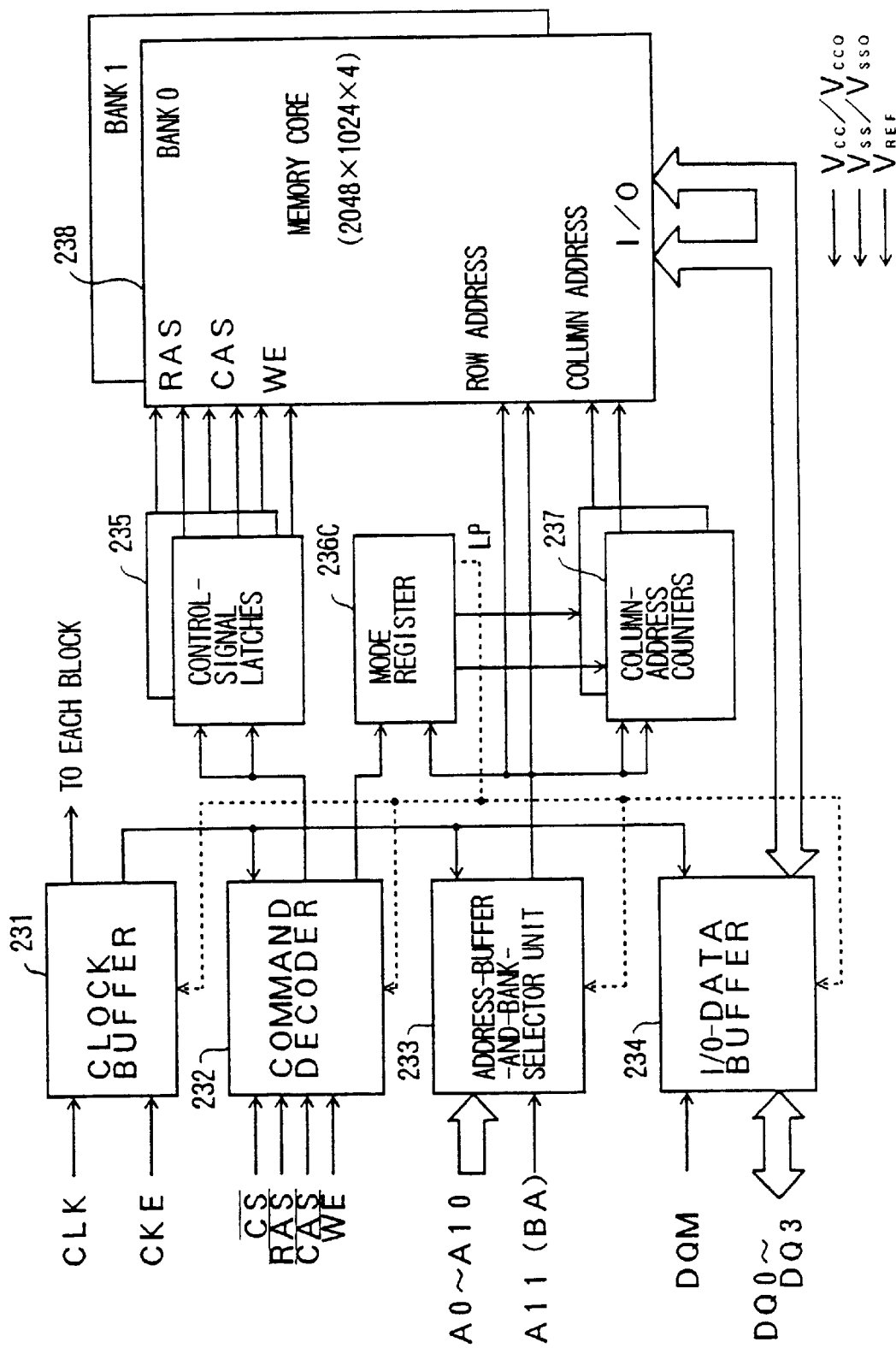
FIG. 11 is a block diagram of a memory of FIG. 10.

FIG. 11 is a block diagram of a memory 13 (FIG. 10). The second principle of the present invention is applied to the memory 13 of FIG. 11. The memory 13 of FIG. 10 is a synchronous DRAM taken as an example, and includes a clock buffer 231, a command decoder 232, an address-buffer-and-bank-selector unit 233, an I/O-data buffer 234, control-signal latches 235, a mode register 236, column-address counters 237, and a memory core 238 including a plurality of memory banks.

The clock buffer 231 buffers a clock signal externally provided, and supplies the clock signal to each block of the memories 13. The command decoder 232 buffers and decodes command inputs, and supplies the decoded results to the control-signal latches 235 and the mode register 236. The address-buffer-and-bank-selector unit 233 receives and buffers a bank address and an intra-bank address for accessing a data-read/write address, and supplies them to the mode register 236, the column-address counters 237, and the memory core 238. Here, data to the mode register 236 is input data provided through address input nodes for setting an operation mode of the memory 13. Data to the memory core 238 is a row address extracted from the received address. The I/O-data buffer 234 is a buffer/register used for inputting/outputting data signals, and works as an intermediary buffer for the memory core 238 to input/output data.

The control-signal latches 235 receive an input from the command decoder 232, and store control signals such as RAS, CAS, and WE for each memory bank of the memory core 238. The column-address counters 237 receive inputs from the address-buffer-and-bank-selector unit 233 and the mode register-236. When an input from the mode register 236 indicates a burst mode, for example, the column-address counters 237 generate successive column addresses to supply them to each memory bank of the memory core 238.

In FIG. 11, each of the clock buffer 231, the command decoder 232, the address-buffer-and-bank-selector unit 233, and the I/0-data buffer 234 is provided with an input buffer according to the second principle of the present invention. Namely, these buffers are equipped with a function to switch between the high-power-consumption buffer suitable for high-speed data transfer and the low-power-consumption buffer having a limited low-speed-data-transfer capacity. In this manner, a reduction in power consumption can be achieved by switching to the low-speed mode in systems complying with the SSTL standard.

As shown by dotted lines in FIG. 11, the mode register 236 supplies the control signal LP to each buffer of the memory 13. In general, the mode register 236 is provided to store information on a burst length, a burst type, a CAS latency, etc, and controls the column-address counters 237 based on this information. In the memory 13 according to the second principle of the present invention, the mode register 236 further stores information indicating either one of the high-speed mode or the low-speed mode, and controls the control signal LP based on this information. The control signal LP is LOW in the high-speed mode and HIGH in the low-speed mode, as in the first through third embodiments of the second principle described above.

Figure 12:
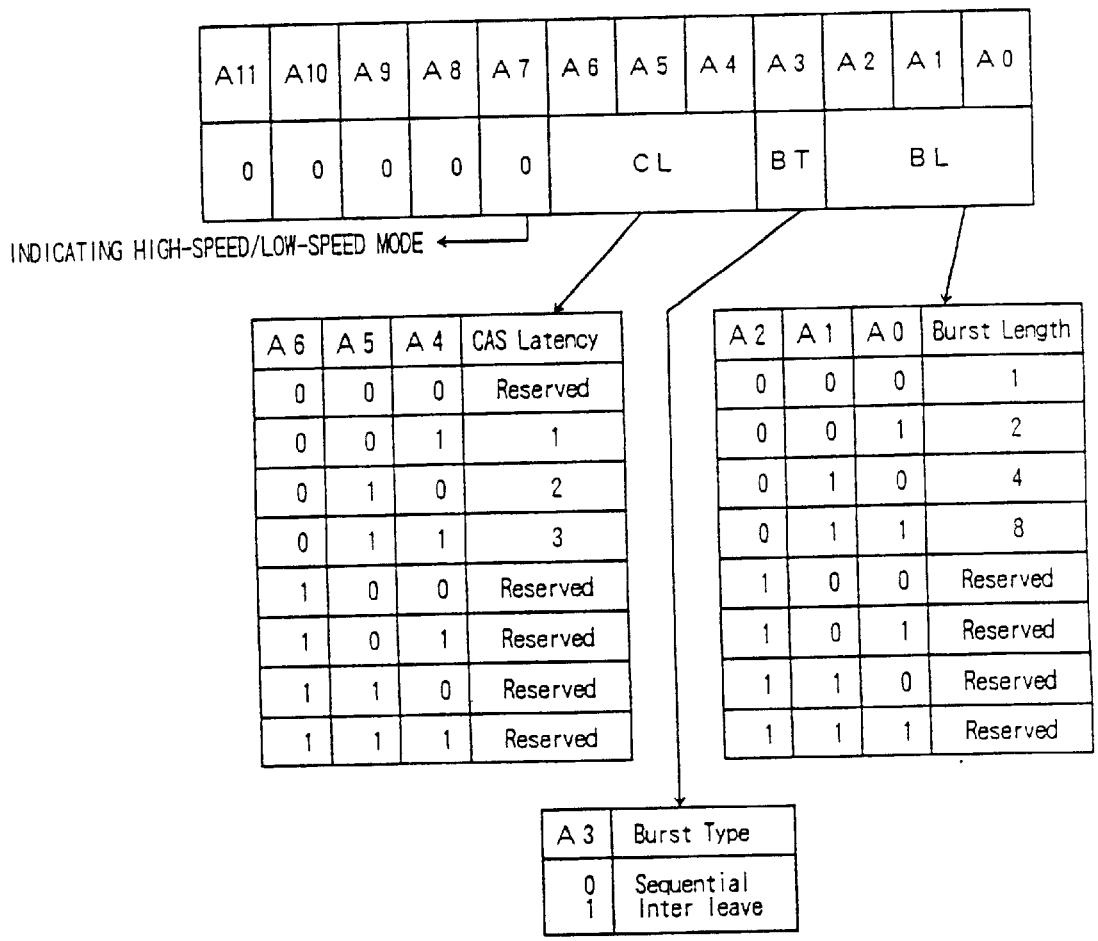
FIG. 12 is an illustrative drawing showing a data structure of data stored in a mode register of the memory of FIG. 11.

FIG. 12 is an illustrative drawing showing a data structure of the data stored in the mode register 236 of the memory 13. Bits A0 through A11 shown in the figure correspond to input pins used for setting the mode register 236.

As shown in FIG. 12, the bits A0 through A2 are used for indicating a burst length. The bit A3 specifies a burst type as being sequential or interleave. The bits A4 through A6 are used for setting a CAS latency. At present, the bits A7 through A11 are generally not used, and are set to zero. In the present invention, the bit A7, for example, is used for indicating one of the high-speed (high-power-consumption) mode and the low-speed (low-power-consumption) mode. For example, the bit A7 set to 0 makes the memory 13 operate in the low-speed mode, and the bit A7 being set to 1 makes the memory 13 operate in the high-speed mode.

Figure 13:
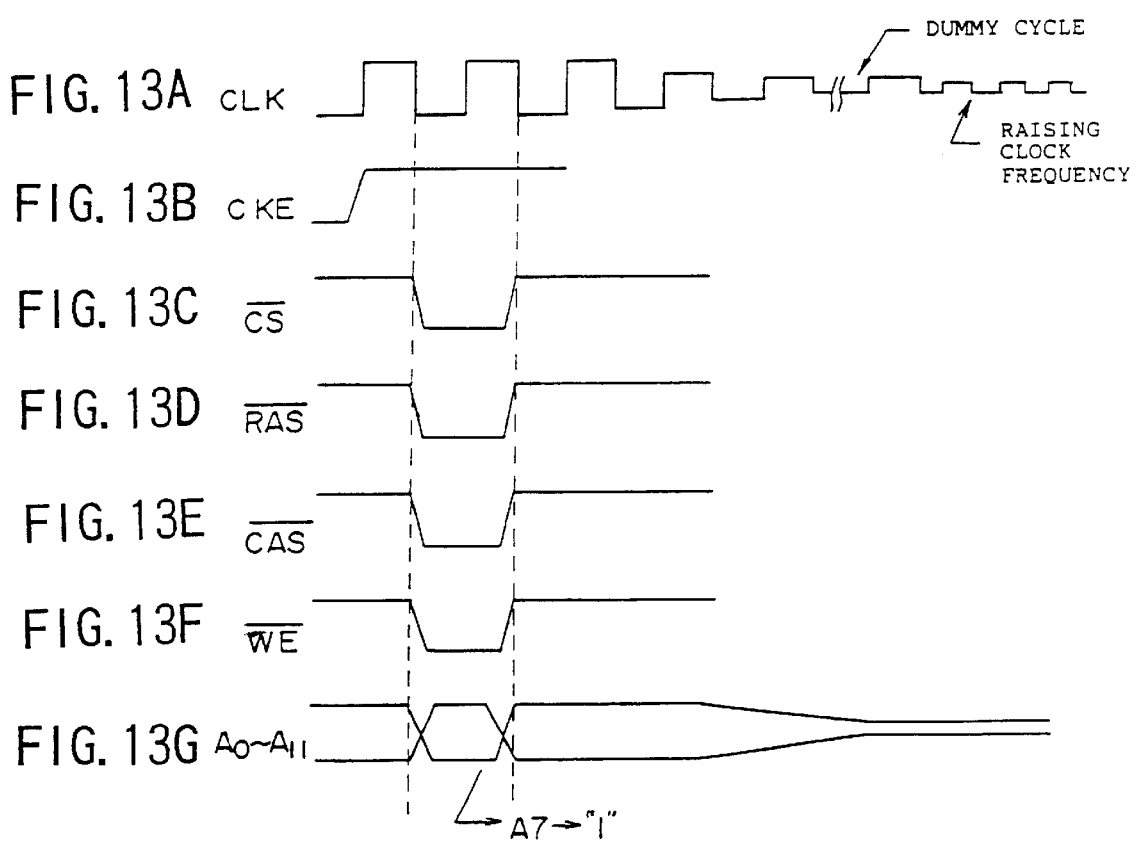
FIGS. 13A through 13G are time charts for explaining clock changes prompted by a change in mode settings.

FIGS. 13A through 13G are time charts for explaining clock changes prompted by a change in the mode setting. In these figures, an example of switching from the low-speed mode to the high-speed mode is shown. As shown in FIG. 13A, a clock signal CLK initially has a large amplitude and a low frequency in accordance with the low-speed mode. Then, a signal CKE (FIG. 13B) is turned to HIGH, and signals /CS, /RAS, /CAS, and /WE (FIGS. 13C through 13F) are changed to LOW, so that data comprising the bit A0 through A11 is set to the mode register 236. In FIG. 13G, signals applied to pins A0 through A11 have 1 at the bit A7.

Following these changes, the control signal LP is changed to LOW. In response, the bus 10 is coupled to the termination voltage Vtt via the terminator units 30A and 30B in FIG. 10. The bus 10 is thus switched to the high-speed data transfer based on SSTL. In reality, a change in the control signal LP to LOW does not prompt instant changes in the internal resistances of the transistors of the terminator units 30A and 30B, but these internal resistances change gradually. Because of this, signals on the bus 10 such as the clock signal CLK of FIG. 13A and the signals A0 through A11 of FIG. 13G have amplitudes which are gradually decreased following the change to LOW of the control signal LP. Until these signals are stabilized, a plurality of clock pulses are allowed to pass by just for the sake of passing time. The clock signal CLK is changed to a higher frequency when the amplitudes on the bus are stabilized.

Figure 14:
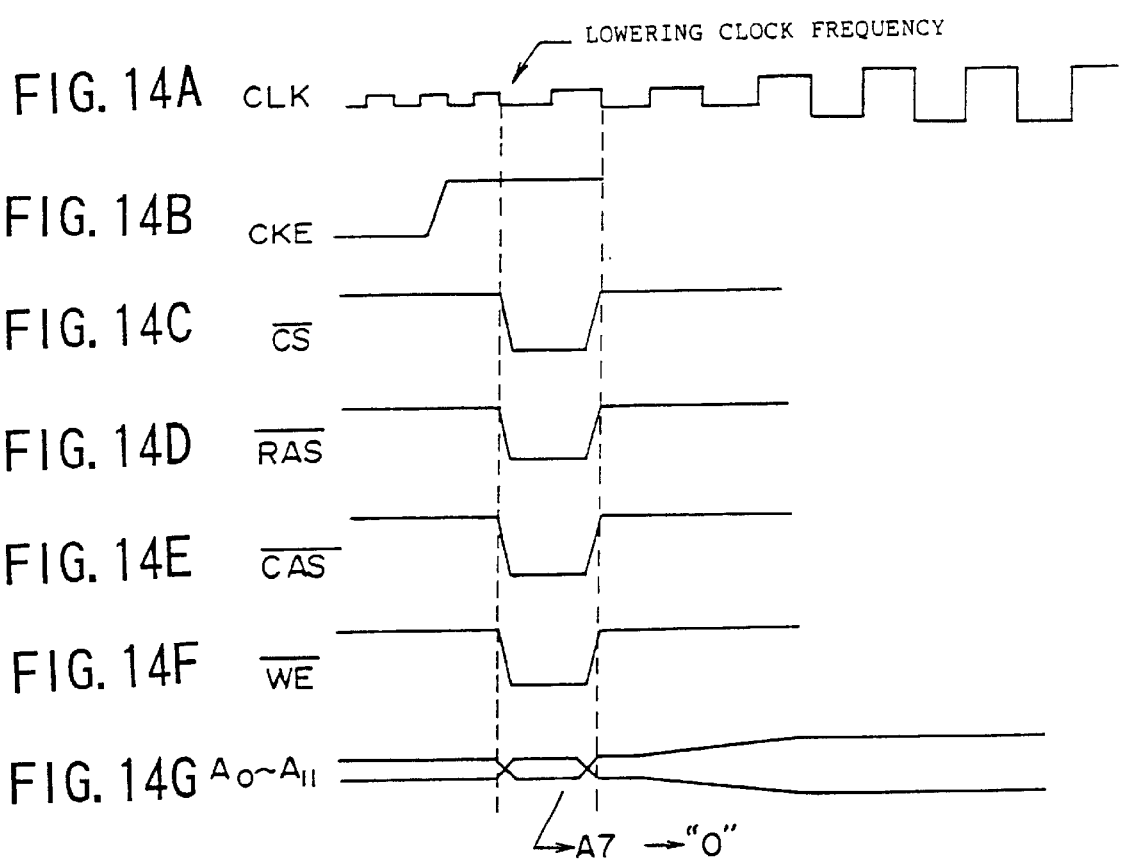
FIGS. 14A through 14G are time charts for explaining clock changes prompted by a change in the mode settings.

FIGS. 14A through 14G are time charts for explaining clock changes prompted by a change in the mode setting. In these figures, an example of switching from the high-speed mode to the low-speed mode is shown. As shown in FIG. 13A, a clock signal CLK initially has a small amplitude and a high frequency in accordance with the high-speed mode. Then, a signal CKE (FIG. 14B) is turned to HIGH, and signals /CS, /RAS, /CAS, and /WE (FIGS. 14C through 14F) are changed to LOW, so that data comprising the bit A0 through A11 is set to the mode register 236. In FIG. 14G, signals applied to pins A0 through A11 have 0 at the bit A7. At the same time, the clock signal CLK changed from the high-frequency clock to a low-frequency clock.

Following these changes, the control signal LP is changed to HIGH. In response, the bus 10 is disconnected from the termination voltage Vtt by the terminator units 30A and 30B in FIG. 10. The bus 10 is thus switched to that of low-speed data transfer and low-power consumption. In reality, a change in the control signal LP to HIGH does not prompt instant changes in the internal resistances of the transistors of the terminator units 30A and 30B, but these internal resistances change gradually. Because of this, signals on the bus such as the clock signal CLK of FIG. 14A and the signals A0 through A11 of FIG. 14G have amplitudes which are gradually increased following the change to HIGH of the control signal LP.

Figure 15:
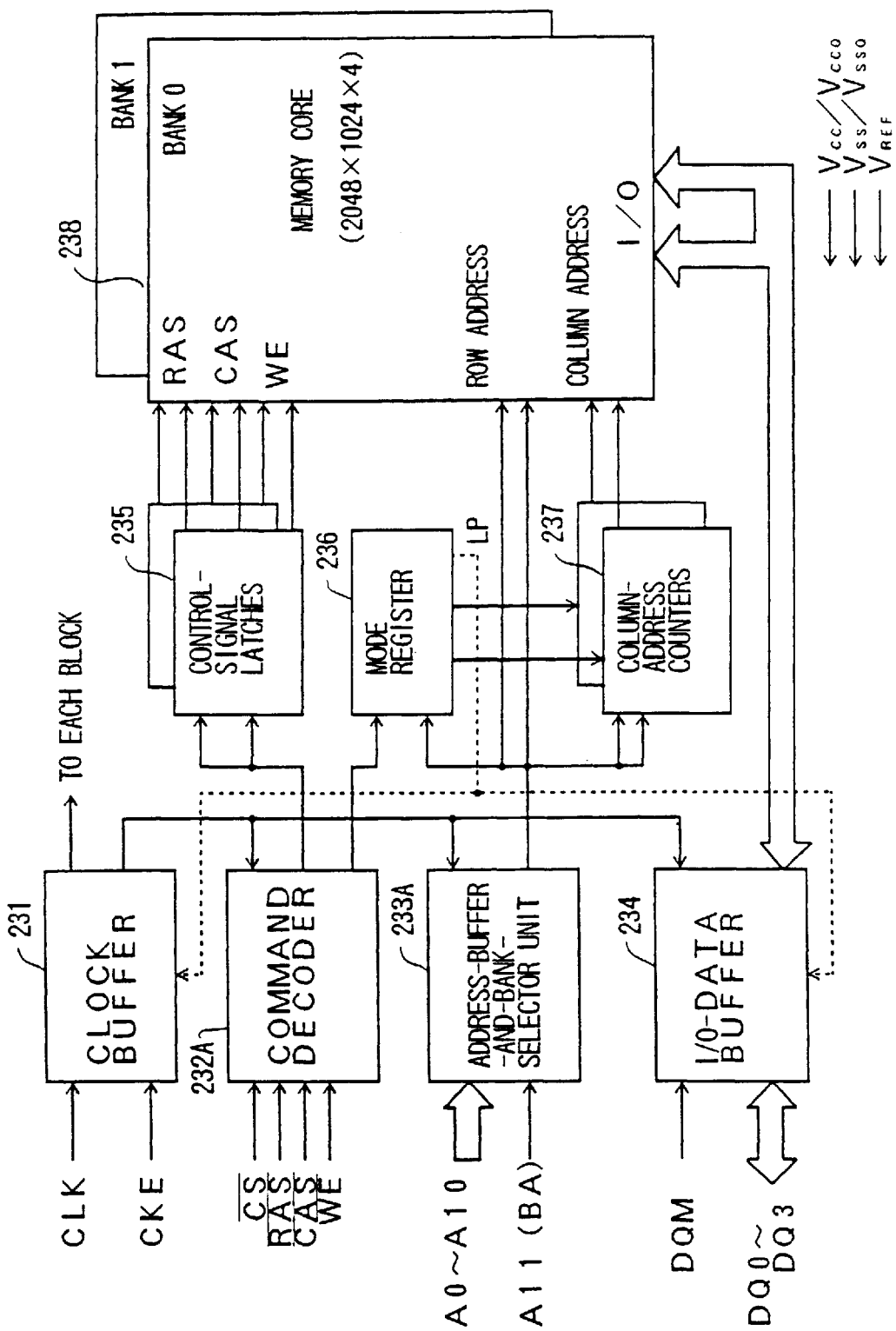
FIG. 15 is a block diagram of a memory which is a variation of the memory of FIG. 11 according to the second principle of the present invention.

FIG. 15 is a block diagram of a memory 13A which is a variation of the memory 13 according to the second principle of the present invention. In the memory 13A, the command decoder 232 and the address-buffer-and-bank-selector unit 233 are replaced by the command decoder 232A and the address-buffer-and-bank-selector unit 233A, respectively. The command decoder 232A and the address-buffer-and-bank-selector unit 233A are buffers of low-speed data transfer and low power consumption, and are not provided with the mode switching function.

In this variation, only the clock buffer 231 and the I/O-data buffer 234 are provided with the mode switching function to switch between the high-speed mode and the low-speed mode. The clock buffer 231 needs the mode switching function because the clock buffer 231 must have a quick response and sufficient timing accuracy in detecting a clock signal, and a low-speed buffer cannot meet these requirements. As for other buffers, buffer ICs which may be provided outside the memory 13A for waveform correction can make these buffers substantially operable in the high-speed mode. Because of this reason, the command decoder 232A and the address-buffer-and-bank-selector unit 233A do not have to have the mode switching function.

Since signal flows of commands and addresses are limited to one direction, these buffer ICs can be used for command input and address input. Since the data signals have two-way signal flows for input and output, transceivers must be used rather than the buffer ICs. Unfortunately, transceivers generally have a problem in that they are slow in operation. In order to avoid the use of these slow transceivers, the I/O-data buffer 234 needs to be equipped with the mode switching function.

Figure 16:
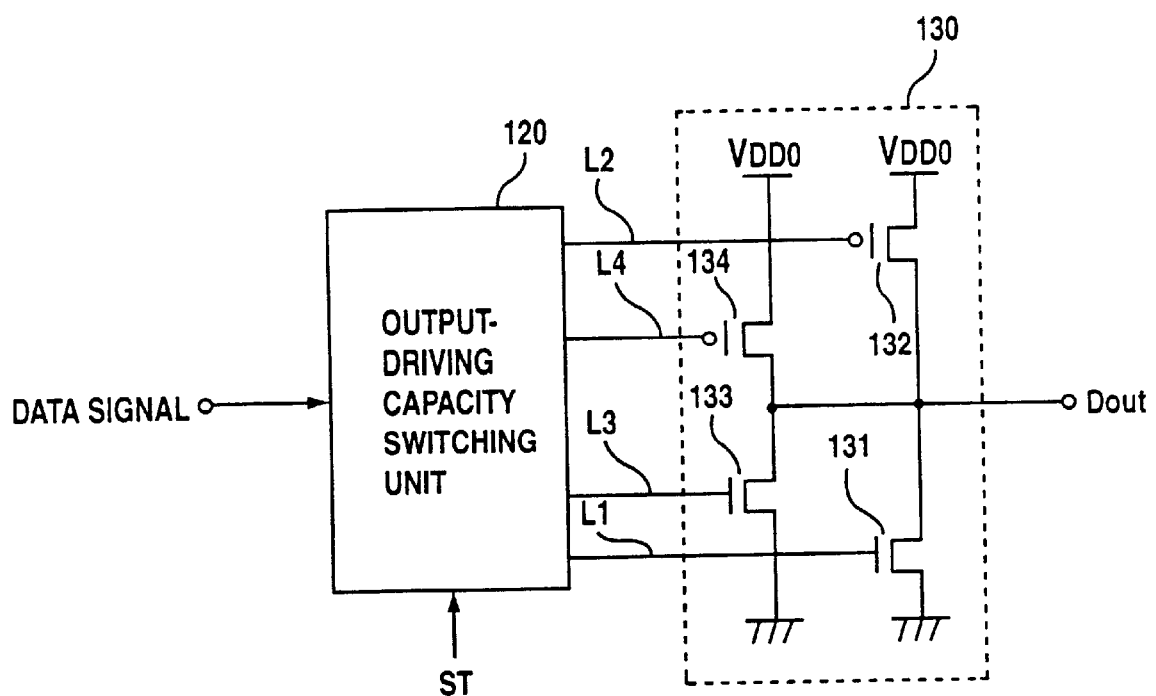
FIG. 16 is an illustrative drawing showing an output buffer unit according to a third principle of the present invention.

FIG. 16 is an illustrative drawing showing an output buffer unit according to a third principle of the present invention. The first principle and the second principle of the present invention achieve a sufficient reduction in power consumption by switching between the high-speed and high-power-consumption mode and the low-speed and low-power-consumption mode in a given SSTL system. The third principle is concerned with a further enhancement of SSTL's high-speed characteristics while enabling use of the same chips in both of SSTL systems and LVTTL systems.

The output buffer unit of FIG. 16 includes an output-driving-capacity switching unit 120 and an output buffer 130. The output buffer 130 includes NMOS transistors 131 and 133 and PMOS transistors 132 and 134. The output-driving-capacity switching unit 120 receives a data signal from an internal circuit, and outputs signals to output nodes L1 through L4. The control signal ST controls the output-driving-capacity switching unit 120 as to which output nodes carry output signals.

The output nodes L1 through L4 are connected to the gates of the transistors 131 through 134 of the output buffer 130. In FIG. 16, the NMOS transistor 131 and the PMOS transistor 132 are used in both an SSTL system and an LVTTL SYSTEM. The NMOS transistor 133 and the PMOS transistor 134 are dedicated for use in the SSTL system.

When the chip is built in the LVTTL system, the control signal ST is set to LOW, for example. The output-driving-capacity switching unit 120 in this case outputs an inverse of the data signal only to the output nodes L1 and L2. That is, the output-driving-capacity switching unit 120 operates such that the output nodes L1 and L2 become LOW when the data signal is HIGH. In response, the PMOS transistor 132 of the output buffer 130 is turned on, and the NMOS transistor 131 is turned off, thereby providing a HIGH signal as an output signal Dout. When the data signal is LOW, the output-driving-capacity switching unit 120 outputs a HIGH level to the output nodes L1 and L2. This HIGH level turns the PMOS transistor 132 off and the NMOS transistor on, thereby producing a LOW signal as an output signal Dout.

When the chip is built in the SSTL system, the control signal ST is set to HIGH, for example. With this setting, the output-driving-capacity switching unit 120 outputs an inverse of the data signal to all the output nodes L1 through L4. That is, the output-driving-capacity switching unit 120 operates such that all the output nodes L1 through L4 become LOW when the data signal is HIGH. In response, the PMOS transistors 132 and 134 of the output buffer 130 are turned on, and the NMOS transistors 131 and 133 are turned off, which leads to the output signal Dout being HIGH. When the data signal is LOW, on the other hand, the output-driving-capacity switching unit 120 outputs a HIGH signal to all the output nodes L1 through L4. In this case, the PMOS transistors 132 and 134 of the output buffer 130 are turned off, and the NMOS transistors 131 and 133 are turned on, thereby generating a LOW signal as the output signal Dout.

When built in the LVTTL system, as previously described, only the NMOS transistor 131 and the PMOS transistor 132 are operated in the output buffer 130. Since the LVTTL system does not have reflection-prevention resistances, sizes of these transistors are chosen such that signals can maintain appropriate waveforms despite the presence of signal reflections. If the driving power of the output buffer 130 is excessively strong, the signal waveforms are disturbed by the signal reflections. In consideration of this, the NMOS transistor 131 preferably has a gate width ranging from 200 $\mu$m to 300 $\mu$m and a gate length of about 1.2 $\mu$m, and the PMOS transistor 132 preferably has a gate width within a range between 800 $\mu$m and 1000 $\mu$m and a gate length of approximately 1.2 $\mu$m.

Figure 1:
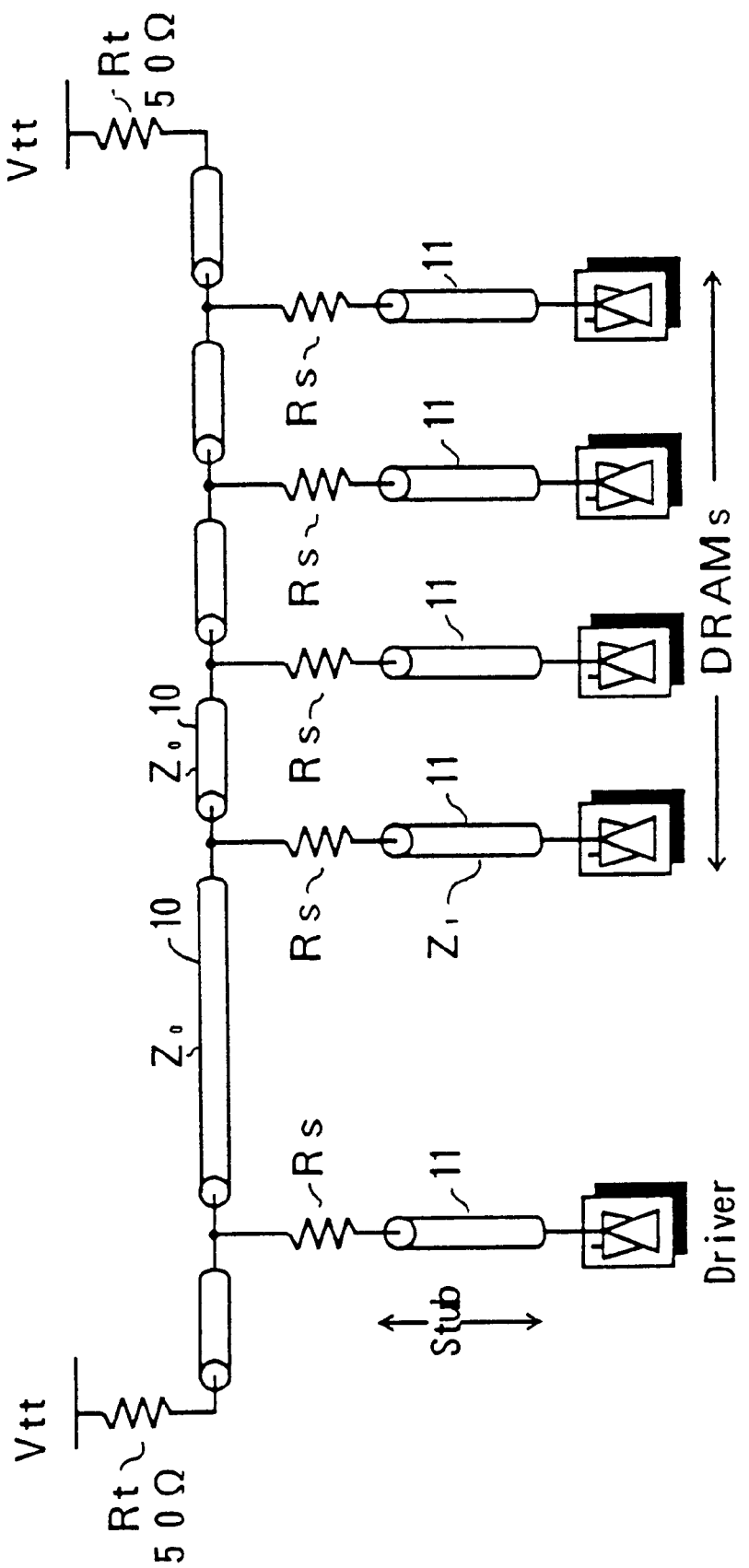
FIG. 1 is an illustrative drawing showing a bus configuration of SSTL.

When built in the SSTL system, the NMOS transistors 131 and 133 and the PMOS transistors 132 and 134 are used in the output buffer 130. In this case, the output buffer 130 has a stronger driving power compared to when built in the LVTTL system. Since the SSTL system has reflection-prevention resistances (Rs of FIG. 1), signals do not have transient fluctuation even if driven by strong driving power, and the use of the strong driving power has a merit to prompt a rapid rise in the signal. At first sight, it seems that signals can be transmitted at high speed by using the SSTL voltage level with driving power weaker than that used in the LVTTL voltage level because the SSTL voltage level has a smaller amplitude than the LVTTL voltage level. Some analysis by the inventor of the present invention, however, revealed that use of stronger driving power for the SSTL voltage level shortens a transmission time for a signal to reach a resistance Rs, thereby enabling faster transmission. Thus, the use of the stronger driving power can further enhance the high-speed characteristics of SSTL. For use in the SSTL system, the NMOS transistors 131 and 133 preferably have a combined gate width of about 240 $\mu$m and a gate length of approximately 1.2 $\mu$m, and the PMOS transistors 132 and 134 preferably have a combined gate width of approximately 900 $\mu$m and an approximately 1.2-$\mu$m gate length.

In this embodiment, the PMOS transistor 132 and the NMOS transistor 131 are operated when built in the LVTTL system, and the PMOS transistors 132 and 134 and the NMOS transistors 131 and 133 are operated when built in the SSTL system. Alternately, the PMOS transistor 132 and the NMOS transistor 131 may be chosen to have stronger driving power than the PMOS transistor 134 and the NMOS transistor 133, so that the PMOS transistor 134 and the NMOS transistor 133 can be used when applied to the LVTTL system, while only the PMOS transistor 132 and the NMOS transistor 131 are driven in the case of the SSTL system.

In this manner, the use of the output buffer unit according to the third principle of the present invention enhances the high-speed characteristics of SSTL, while same chips are usable in either of SSTL systems or LVTTL systems.

Figure 17:
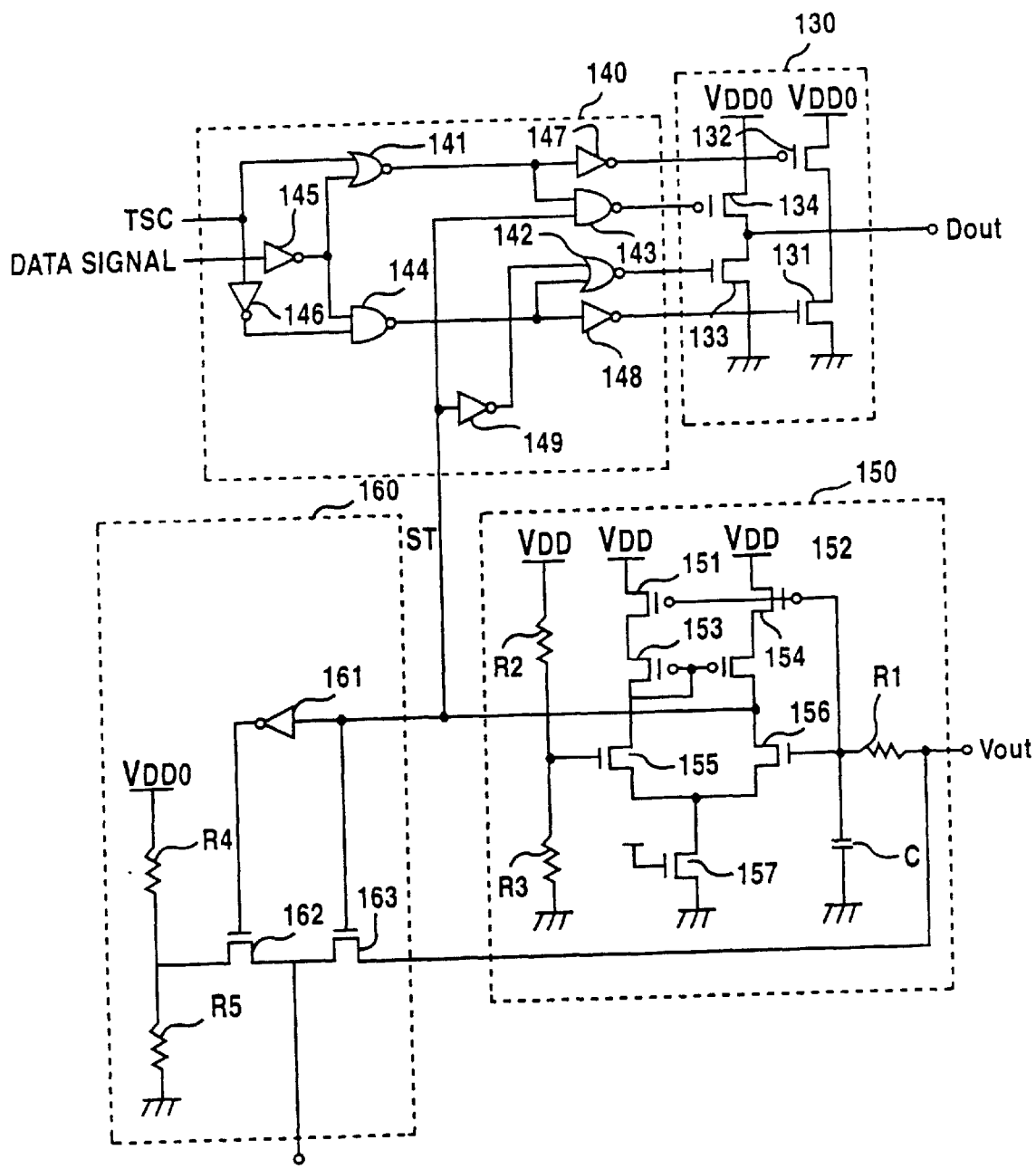
FIG. 17 is a circuit diagram of an embodiment of an output buffer unit according to the third principle of the present invention.

FIG. 17 is a circuit diagram of an embodiment of an output buffer unit according to the third principle of the present invention. The output buffer unit of FIG. 17 includes an output buffer 130, an output-driving-power switching unit 140, a reference-voltage-comparison unit 150, and a reference-voltage-generation unit 160. In FIG. 17, the same elements as those of FIG. 16 are referred to by the same numerals, and a description thereof will be omitted.

The output-driving-power switching unit 140 includes NOR circuits 141 and 142, NAND circuits 143 and 144, and inverter 145 through 149. The output-driving-power switching unit 140 receives signal TSC, data signal, and the control signal ST. The signal TSC is used for controlling tri-state buffer operations, and the output node Dout is in a floating (high-impedance) state when this signal TSC is HIGH. The signal TSC is LOW when signals are output from the output buffer 130.

First, operations are looked into in the case of the signal TSC being HIGH. In this case, an output of the NOR circuit 141 is LOW at all times, so that outputs of the inverter 147 and the NAND circuit 143 are HIGH. The NAND circuit 144, which receives an inverse of the signal TSC, outputs HIGH at all times, so that outputs of the inverter 148 and the NOR circuit 142 are LOW. Consequently, all the transistors of the output buffer 130 are turned off, thereby placing the output node Dout in a floating state.

Next, operations when applied to an LVTTL system or an SSTL system are looked into in the case of the signal TSC being LOW for signal output.

In the LVTTL system, the control signal ST is LOW. An output of the NAND circuit 143 in this case becomes HIGH at all times at the output node L4. Since the NOR circuit 142 receives the inverse of the control signal ST, the NOR circuit 142 outputs LOW at all times at the output node L3. Accordingly, the NMOS transistor 133 and the PMOS transistor 134 of the output buffer 130 are not operated. Since the signal TSC is LOW, each of the NOR circuit 141 and the NAND circuit 144 operates as an inverter. Accordingly, the inverter 148 and the inverter 147 produce an inverse signal of the data signal at the output node L1 and the output node L2, respectively. As a result, the output signal Dout of the output buffer 130 is the data signal driven by the NMOS transistor 131 and the PMOS transistor 132.

In the SSTL system, the control signal ST is HIGH. Receiving the control signal ST at one input, the NAND circuit 143 serves as an inverter for the other input thereof. Receiving the inverse of the control signal ST at one input, the NOR circuit 142 provides a function to invert the other input thereof. Therefore, the output nodes L1 through L4 output the inverse of the data signal. The output signal Dout of the output buffer 130 are thus the data signal driven by the transistors 131 through 134.

The reference-voltage-comparison unit 150 receives the reference voltage Vref, and detects the level of the reference voltage Vref. The reference-voltage-comparison unit 150 generates the control signal ST of a LOW level when the reference voltage Vref indicates the LVTTL system, and produces the control signal ST of a HIGH level when it is the SSTL system. The reference voltage Vref is 3.3 V in the case of LVTTL and 1.5 V in the case of SSTL, for example.

The reference-voltage-comparison unit 150 includes resistances R1 through R3, a capacitor C, PMOS transistors 151 through 154, and NMOS transistors 155 through 157. The resistance R1 and the capacitor C comprise a high-cut filter. The reference voltage Vref passing through the high-cut filter is input to a differential amplifier which is made up from the PMOS transistors 153 and 154 and the NMOS transistors 155 through 157. The differential amplifier receives at the other input a comparison voltage V which is generated by the resistances R2 and R3 connected in a series. This comparison voltage V is set to about 2 V. The differential amplifier compares the comparison voltage V with the reference voltage Vref, and outputs LOW as the control signal ST when the reference voltage Vref is larger. When the reference voltage Vref is smaller, the differential amplifier outputs a HIGH level as the control signal ST.

The reference voltage Vref passing through the high-cut filter is also provided to the PMOS transistors 151 and 152, which are inserted into the power supply nodes of the differential amplifier. The PMOS transistors 151 and 152 are provided in order to cut the power to the differential amplifier in the case of LVTTL, so that wasteful consumption of power is avoided. When the reference voltage Vref is that of the LVTTL level, the differential amplifier is not actually operated. In actuality, the turning on of the NMOS transistors 156 and 157 produces the LOW control signal ST.

The reference-voltage-generation unit 160 is controlled by the control signal ST generated by the reference-voltage-comparison unit 150. The reference-voltage-generation unit 160 supplies the externally provided reference voltage Vref to each input buffer in the chip in the case of SSTL, and supplies an internally generated reference voltage Vref to each input buffer in the case of LVTTL.

The reference-voltage-generation unit 160 includes an inverter 161, NMOS transistors 162 and 163, and resistances R4 and R5. In the case of LVTTL, the control signal ST is LOW, so that the NMOS transistor 163 is turned off and the inverter 161 outputs HIGH. Receiving this HIGH output from the inverter 161, the NMOS transistor 162 is turned on. The resistances R4 and R5 are connected in a series to effect voltage division to generate a reference voltage Vref. This internally generated reference voltage Vref is supplied to each input buffer in the chip via the NMOS transistor 162. In the case of SSTL, the control signal ST is HIGH, so that the NMOS transistors 162 and 163 are off and on, respectively. Via the NMOS transistor 163, the externally provided reference voltage Vref is supplied to each input buffer in the chip.

Figure 18:
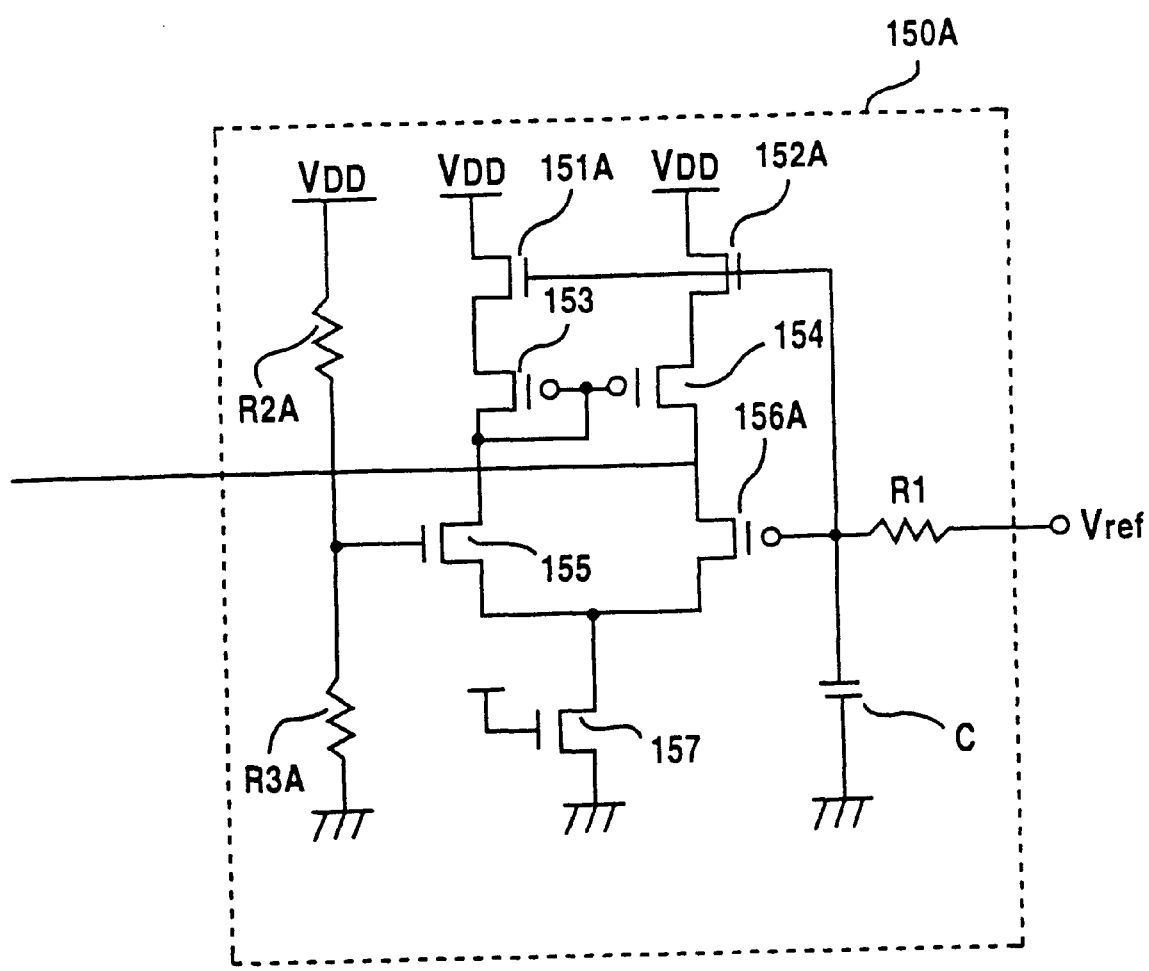
FIG. 18 is a circuit diagram showing a variation of a reference-voltage-comparison unit of FIG. 17.

FIG. 18 is a circuit diagram showing a variation of the reference-voltage-comparison unit 150. In a reference-voltage-comparison unit 150A of FIG. 18, the PMOS transistors 151 and 152 and the NMOS transistor 156 of the reference-voltage-comparison unit 150 of FIG. 17 are replaced by the NMOS transistors 151A and 152A and the PMOS transistor 156A having an inverse transistor type, respectively. Further, the resistances R2 and R3 are changed to resistances R2A and R3A.

The reference voltage Vref applied to the reference-voltage-comparison unit 150A of FIG. 18 is 0 V in the case of LVTTL and 1.5 V in the case of SSTL, for example. The resistances R2A and R3A, connected in a series, generate an intermediate voltage between 0 V and 1.5 V, which is used as the comparison voltage V. In a similar manner to operations of the reference-voltage-comparison unit 150 of FIG. 17, the control signal ST becomes LOW when the chip is built in the LVTTL system, and becomes HIGH when the chip is built in the SSTL system.

In the above-described embodiments of the third principle of the present invention, the reference voltage Vref is used in the comparison to switch the driving powers. The third principle of the present invention, however, is not limited to these embodiments. For example, the control signal ST may be received from an external source by providing an input node for receiving the control signal ST, or the control signal ST may be set in a mode register when the chip is a DRAM chip or the like, by giving a command to set the control signal ST in the mode register.

Figure 19:
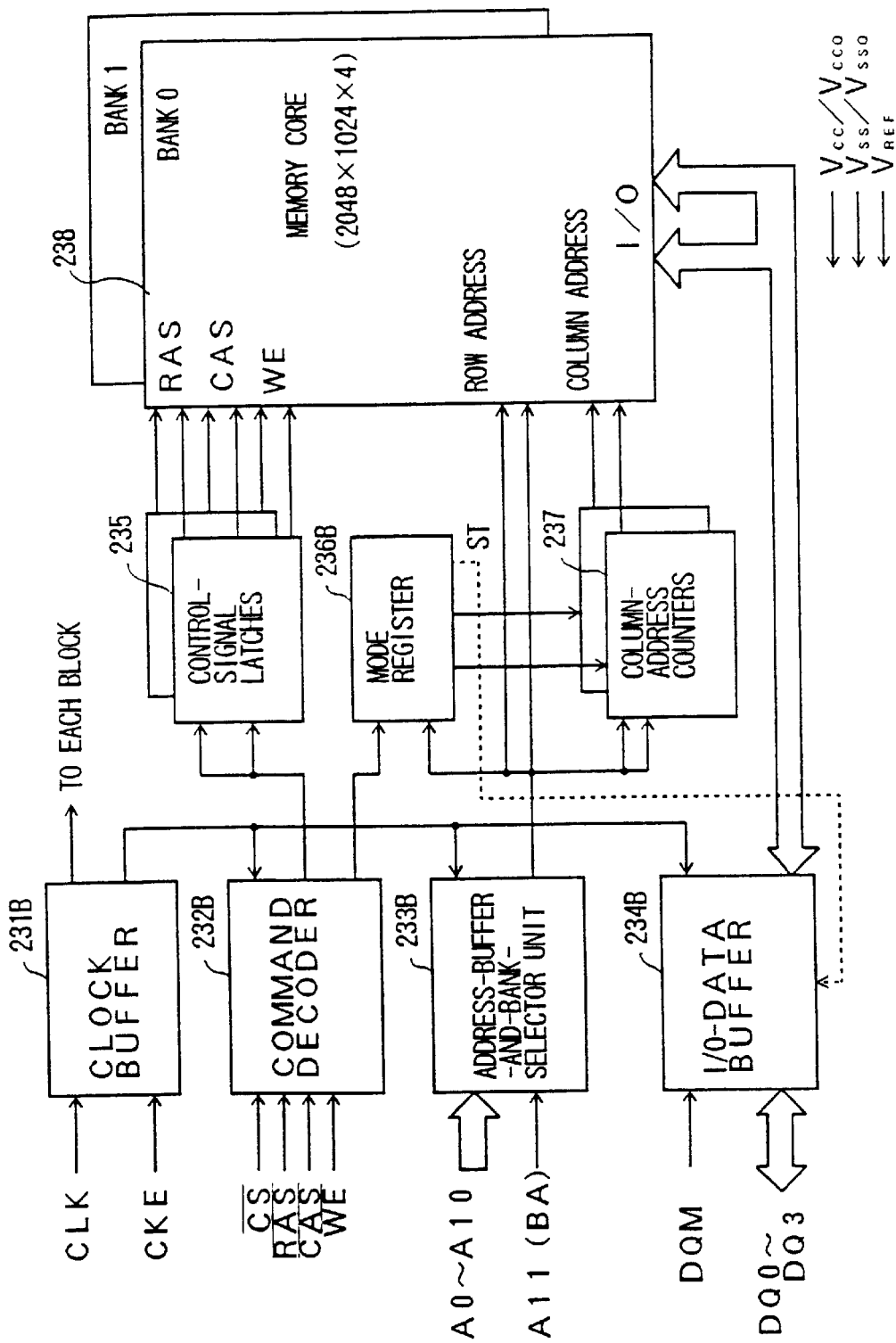
FIG. 19 is a block diagram of a synchronous DRAM to which the third principle of the present invention is applied.

FIG. 19 is a block diagram of a synchronous DRAM to which the third principle of the present invention is applied. In FIG. 19, the same elements as those of FIG. 11 are referred to by the same numerals, and a description thereof will be omitted.

A memory 13B of FIG. 19 differs from the memory 13 of FIG. 11 in each buffer and the mode register. The memory 13B of FIG. 19 includes a clock buffer 231B, a command decoder 232B, an address-buffer-and-bank-selector unit 233B, an I/O-data buffer 234B, and a mode register 236B. The clock buffer 231B, the command decoder 232B, and the address-buffer-and-bank-selector unit 233B may be high-speed buffers generally used in the field. When the low-speed mode is used in an SSTL system for power conservation, however, these buffers may be provided with the function to switch between the high-speed (high-power-consumption) mode and the low-speed (low-power-consumption) mode.

The I/O-data buffer 234B is an output buffer according to the third principle of the present invention. The mode register 236B stores information indicating either one of SSTL or LVTTL, and controls the control signal ST based on this information. This information is set to the mode register 236B in the same manner as described with reference to FIG. 12. The setting of this information, however, is made at the time of system implementation or system activation by indicating whether an SSTL system is to be used or an LVTTL system is to be used.

The control signal ST from the mode register 236B is supplied to the I/O-data buffer 234B. Based on the control signal ST, an output buffer of the I/O-data buffer 234B steps up the output driving power when the chip is used in the SSTL system.

In the DRAM of FIG. 11 previously described according to the second principle, the control signal LP for switching between the high-speed and high-power-consumption mode and the low-speed and low-power-consumption mode is stored in the mode register 236. Since currently used DRAMs have many unused pins, however, some of these unused pins may be used as control-input pins for switching power-consumption modes.

Figure 20:
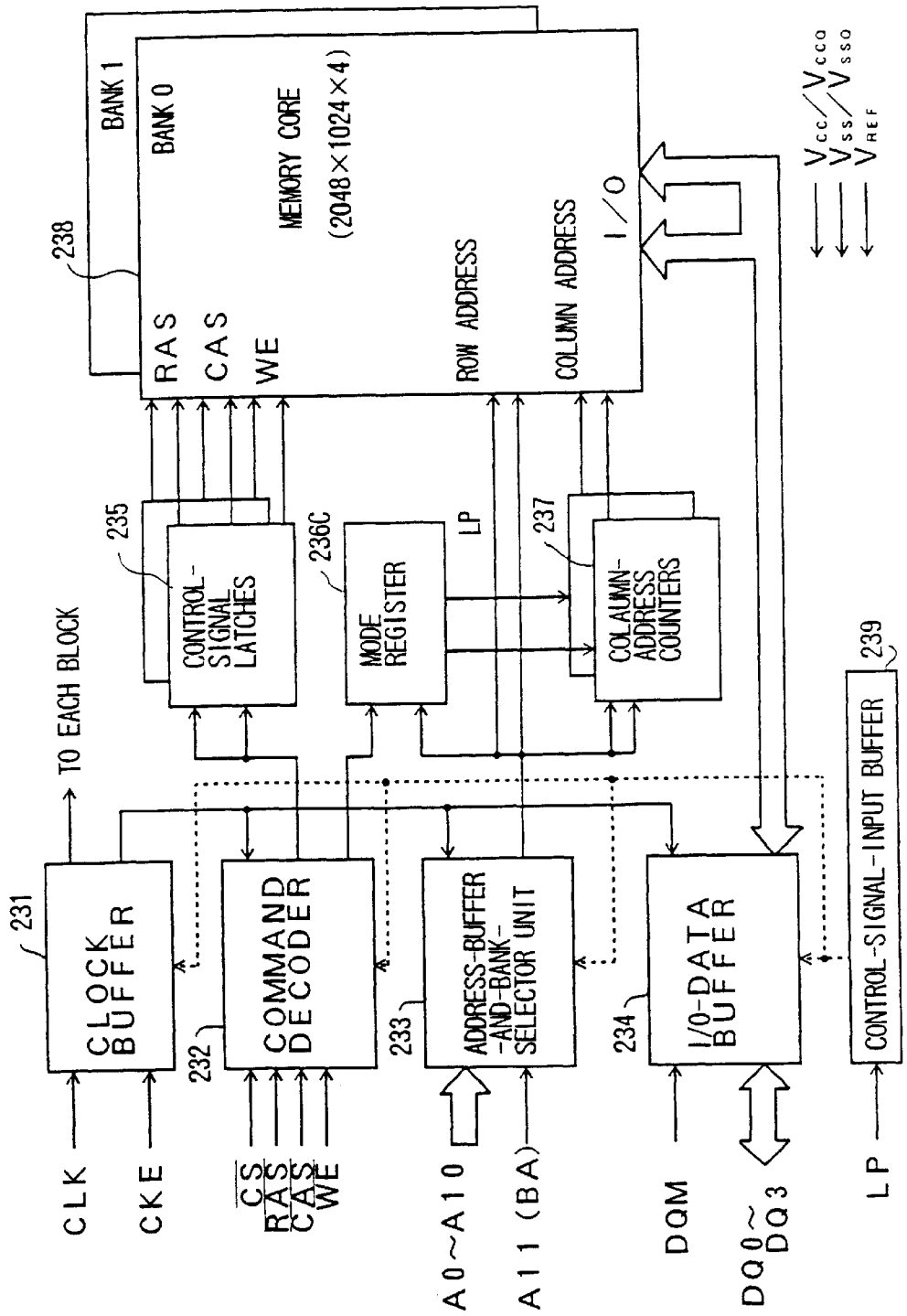
FIG. 20 is a block diagram showing a variation of the DRAM of FIG. 11.

FIG. 20 is a block diagram showing a variation of the DRAM of FIG. 11. In FIG. 20, the same elements as those of FIG. 11 are referred to by the same numerals, and a description thereof will be omitted. The DRAM of FIG. 20 includes a mode register 236C and a control-signal-input buffer 239. As shown in FIG. 20, the control signal LP is externally provided to the control-signal-input buffer 239, and the control-signal-input buffer 239 supplies the received control signal LP to each buffer in the chip.

In the same manner, the DRAM of FIG. 19 according to the third principle may receive the control signal ST at a pin which is unused in traditional use of the DRAM chip.

Further, the present invention is not limited to these embodiments, but variations and modifications may be made without departing from the scope of the present invention.

What is claimed is:

1. An input buffer circuit connected to a bus for receiving signals from said bus, said input buffer comprising:

a first buffer receiving said signals, said first buffer operating in a first mode in which said signals are transmitted on said bus through a first frequency;

a second buffer receiving said signals, said second buffer operating in a second mode in which said signals are transmitted on said bus through a second frequency lower than said first frequency; and means for providing one of an output of said first buffer and an output of said second buffer to an internal circuit, wherein power consumption of said second buffer during operation thereof is lower than power consumption of said first buffer during operation thereof, and wherein said first buffer comprises a first differential amplifier for determining levels of said signals through comparison with a reference voltage, and wherein said second buffer operates in said first mode in addition to said second mode and comprises a second differential amplifier for determining said levels of said signals through comparison with said reference voltage, said second differential amplifier being connected in parallel with said first buffer and having transistors with a narrower gate width than transistors of said first differential amplifier.

2. The input buffer circuit as claimed in claim 1, further comprising:

generation means generating said reference voltage; and switch means for supplying to said first buffer and said second buffer said reference voltage externally provided in said first mode, and for supplying to said first buffer and said second buffer said reference voltage internally generated by said generation means in said second mode.

3. A DRAM comprising:

a circuit unit configured to generate a control signal based on information stored in a register;

a first buffer for receiving data signals transmitted through a first frequency in a first mode, said first buffer being controlled by said control signal to operate in said first mode;

a second buffer for receiving the date signals transmitted through the first frequency in the first mode and for receiving data signals transmitted through a second frequency lower than said first frequency in a second mode;

a circuit unit configured to provide an output of said first buffer and an output of said second buffer to an internal circuit.

4. An input buffer circuit receiving a signal, comprising:

a first differential amplifier having a pair of first transistors, one of which receives said signal and the other of which receives a reference signal, the first differential amplifier comparing levels of said signal and reference signal in a first mode in which the signal has a small amplitude;

a second differential amplifier having a pair of second transistors with narrower gate widths than said first transistors, one of which receives said signal and the other of which receives said reference signal, and the second differential amplifier compares said signal and reference signal in a second mode in which the signal has a large amplitude; and a buffer circuit coupled to said first and second differential amplifiers for outputting an output signal to an internal circuit.

5. The input buffer circuit as claimed in claim 4, the second differential amplifier operates in the first mode.

6. The input buffer circuit as claimed in claim 4, said signal has the small amplitude being a SSTL signal, and said signal has the large amplitude being a LVTTL signal.

7. The input buffer circuit as claimed in claim 4, wherein an operation of the first differential amplifier is controlled by a mode selection signal.

8. The input buffer circuit as claimed in claim 4, wherein one of a first reference voltage and a second reference voltage is selected as the reference signal in response to a mode selection signal.

9. The input buffer circuit as claimed in claim 8, wherein one of a first reference voltage and a second reference voltage is selected as the reference signal in response to a mode selection signal.

10. The input buffer circuit as claimed in claim 7, wherein said mode selection signal is generated based on information stored in a register.

\* \* \* \* \*

UNITED STATES PATENT AND TRADEMARK OFFICE
CERTIFICATE OF CORRECTION

PATENT NO.     : 6,480,030 B1
DATED          : November 12, 2002
INVENTOR(S)    : Taguchi It is certified that error appears in the above-identified patent and that said Letters Patent is hereby corrected as shown below:

Column 19,
Line 11, please change "date signals" to -- data signals --.

Signed and Sealed this

Eighteenth Day of February, 2003

JAMES E. ROGAN
*Director of the United States Patent and Trademark Office*